(12) United States Patent
Fujii

(10) Patent No.: US 7,841,076 B2
(45) Date of Patent: Nov. 30, 2010

(54) MANUFACTURING METHOD OF WIRING SUBSTRATE AND MANUFACTURING METHOD OF SEMICONDUCTOR DEVICE

(75) Inventor: Tomoharu Fujii, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 10 days.

(21) Appl. No.: 11/727,547

(22) Filed: Mar. 27, 2007

(65) Prior Publication Data

US 2007/0231962 A1    Oct. 4, 2007

(30) Foreign Application Priority Data

Mar. 29, 2006  (JP)  .................... P2006-091483

(51) Int. Cl.
*H05K 3/30*   (2006.01)

(52) U.S. Cl. .................... 29/832; 29/600; 29/592.1; 343/700 MS; 343/895; 257/700

(58) Field of Classification Search .................. 29/600, 29/601, 830–834, 846–847, 592.1, 594–595; 174/255, 264; 343/700 MS, 754, 724–729, 343/702, 895; 340/572.1; 257/700, 754, 257/778

See application file for complete search history.

(56) References Cited

U.S. PATENT DOCUMENTS

| 4,864,314 | A  | * | 9/1989  | Bond ................... 343/700 MS |
| 5,748,152 | A  | * | 5/1998  | Glabe et al. ............... 343/767 |
| 6,166,705 | A  | * | 12/2000 | Mast et al. ............... 343/853 |
| 6,281,843 | B1 | * | 8/2001  | Evtioushkine et al. 343/700 MS |
| 6,421,013 | B1 | * | 7/2002  | Chung ................ 343/700 MS |
| 6,549,172 | B1 | * | 4/2003  | Thevenot et al. ............. 343/756 |
| 6,591,494 | B2 | * | 7/2003  | Okamura et al. ............. 29/832 |
| 6,801,165 | B2 | * | 10/2004 | Fang .................... 343/700 MS |
| 6,988,312 | B2 | * | 1/2006  | Nakamura et al. ............. 29/830 |
| 7,098,854 | B2 | * | 8/2006  | Herrick ............... 343/700 MS |
| 7,248,133 | B2 | * | 7/2007  | Koga et al. ................... 333/193 |
| 2004/0074088 | A1 | | 4/2004 | Nakamura et al. |
| 2005/0155222 | A1 | | 7/2005 | Nakamura |

FOREIGN PATENT DOCUMENTS

JP    2000-91717    3/2000

* cited by examiner

*Primary Examiner*—Minh Trinh
(74) *Attorney, Agent, or Firm*—Drinker Biddle & Reath LLP

(57) ABSTRACT

A multilayer wiring structural body 13 is formed on a surface 57A of a metal plate 57 used as a support plate in the case of forming the multilayer wiring structural body 13, and the metal plate 57 is patterned and a slot antenna 60 is formed.

10 Claims, 38 Drawing Sheets

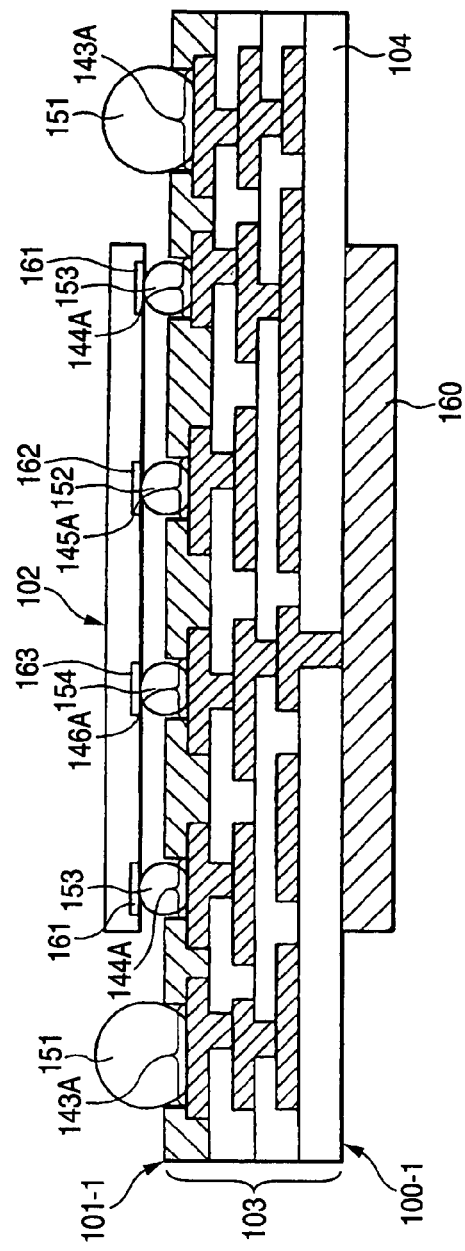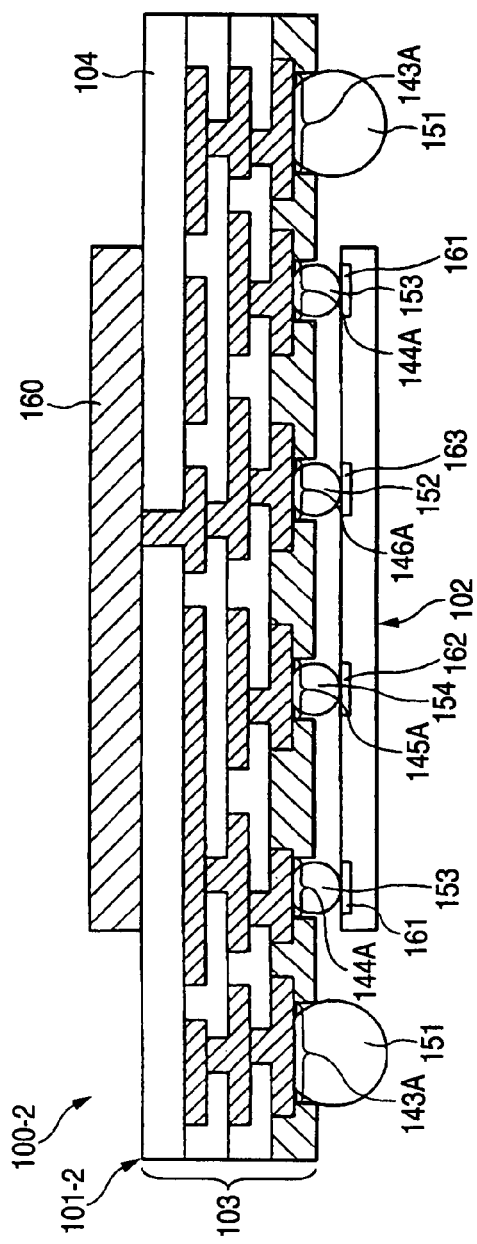
FIG. 35

MANUFACTURING METHOD OF WIRING SUBSTRATE AND MANUFACTURING METHOD OF SEMICONDUCTOR DEVICE

This application claims priority to Japanese Patent Application No. 2006-091483, filed Mar. 29, 2006, in the Japanese Patent Office. The priority application is incorporated by reference in its entirety.

TECHNICAL FIELD

The present disclosure relates to a manufacturing method of a wiring substrate comprising a multilayer wiring structural body, an antenna and an electronic component disposed in the multilayer wiring structural body, and a manufacturing method of a semiconductor device.

RELATED ART

With miniaturization of wireless communication equipment in recent years, miniaturization of a semiconductor device installed in the wireless communication equipment has been desired and the miniaturized semiconductor device includes, for example, a semiconductor device 300 as shown in FIG. 1.

FIG. 1 is a sectional view of a related-art semiconductor device.

Referring to FIG. 1, a related-art semiconductor device 300 has a wiring substrate 301, electronic components 302, 303, a metal plate 308 and a slot antenna 310. The wiring substrate 301 has a core substrate 305, a first multilayer wiring structural body 306 and a second multilayer wiring structural body 307.

The first multilayer wiring structural body 306 is configured to laminate plural insulating layers and wiring patterns (not shown), and is disposed on an upper surface 305A of the core substrate 305. The second multilayer wiring structural body 307 is configured to laminate plural insulating layers and wiring patterns (not shown), and is disposed on a lower surface 305B of the core substrate 305. The wiring patterns (not shown) of the second multilayer wiring structural body 307 are electrically connected to the wiring patterns (not shown) of the first multilayer wiring structural body 306 through a through via (not shown) disposed in the core substrate 305.

The metal plate 308 is disposed on a surface 307B of the second multilayer wiring structural body 307. The metal plate 308 is formed in a plate shape and is set at a ground potential. The slot antenna 310 is disposed in the metal plate 308. The slot antenna 310 is constructed by a through groove 309 disposed in the metal plate 308, and the metal plate 308 corresponding to a side wall of the through groove 309.

The electronic components 302, 303 are electrically connected to the wiring patterns (not shown) of the first multilayer wiring structural body 306. As the electronic component 302, for example, an RFIC (a circuit element for generating a signal) can be used. Also, as the electronic component 303, for example, a control circuit element for controlling a signal from the RFIC can be used.

By connecting the electronic components 302, 303 to one surface of the wiring substrate 301 and disposing the slot antenna 310 on the other surface of the wiring substrate 301 thus, a size in a surface direction of the wiring substrate 301 can be miniaturized as compared with the case of disposing the electronic components 302, 303 and the slot antenna 310 on the same plane of the wiring substrate 301, so that the semiconductor device 300 can be miniaturized (for example, see Japanese Patent Unexamined Publication No. 2000-91717 (Patent Reference 1)).

The wiring substrate 301 is manufactured by forming the first and second multilayer wiring structural bodies 306, 307 on both surfaces 305A, 305B of the core substrate 305 by a build-up method.

However, in the related-art manufacturing method of the wiring substrate 301, there were problems in which it is difficult to improve productivity of the wiring substrate 301 and a manufacturing cost of the wiring substrate 301 cannot be reduced. Consequently, there was a problem of increasing a manufacturing cost of the semiconductor device 300.

SUMMARY

Embodiments of the present invention provide a manufacturing method of a wiring substrate capable of reducing a manufacturing cost of a semiconductor device and a wiring substrate miniaturized, and a manufacturing method of a semiconductor device.

According to one standpoint of one or more embodiments of the invention, a manufacturing method of a wiring substrate, including a multilayer wiring structural body having a wiring pattern and an insulating layer laminated, and an antenna disposed on one surface of the multilayer wiring structural body, an electronic component being mounted on the other surface opposite to the one surface of the multilayer wiring structural body, the manufacturing method characterized by comprising a multilayer wiring structural body formation step of forming the multilayer wiring structural body on a metal plate used as a support plate in the case of forming the multilayer wiring structural body, and an antenna formation step of patterning the metal plate and forming the antenna is provided.

In a related-art manufacturing method of a wiring substrate, a metal plate is used as a support plate in the case of forming the multiplayer wiring structural body by a build-up method in order form a thin wiring substrate, and after forming the multiplayer wiring structural body, the metal plate is removed. However, according to the one or more embodiments of the invention, by patterning a metal plate used as a support plate in the case of forming a multilayer wiring structural body and forming an antenna, the need for a step of removing the metal plate after forming the multilayer wiring structural body is eliminated, so that the number of manufacturing steps of a wiring substrate can be reduced, so that a manufacturing cost of the wiring substrate can be reduced.

According to another standpoint of one or more embodiments of the invention, a manufacturing method of a wiring substrate, including a multilayer wiring structural body having a wiring pattern and an insulating layer laminated, and an antenna disposed on one surface of the multilayer wiring structural body, an electronic component being mounted on the other surface opposite to the one surface of the multilayer wiring structural body, the manufacturing method characterized by comprising a metal plate preparation step of preparing first and second metal plates used as support plates in the case of forming the multilayer wiring structural bodies, a metal plate pasting step of pasting the first metal plate to the second metal plate so as to oppose a surface opposite to a surface of the first metal plate on which the multilayer wiring structural body is formed to a surface opposite to a surface of the second metal plate on which the multilayer wiring structural body is formed, a multilayer wiring structural body formation step of simultaneously forming the multilayer wiring structural bodies on the first and second metal plates, and an antenna formation step of patterning the first and second metal plates and forming the antennas in the first and second metal plates is provided.

According to the one or more embodiments of the invention, by disposing a multilayer wiring structural body formation step of forming multilayer wiring structural bodies on pasted first and second metal plates and an antenna formation step of patterning the first and second metal plates and forming antennas in the first and second metal plates, two wiring substrates can be manufactured at once, so that a manufacturing cost of the wiring substrate can be reduced.

According to a further standpoint of one or more embodiments of the invention, a manufacturing method of a semiconductor device, including a multilayer wiring structural body having a wiring pattern and an insulating layer laminated, an antenna disposed on one surface of the multilayer wiring structural body, and an electronic component which is disposed on the other surface opposite to the one surface of the multilayer wiring structural body and is electrically connected to the multilayer wiring structural body, the manufacturing method characterized by comprising a multilayer wiring structural body formation step of forming the multilayer wiring structural body on a metal plate used as a support plate in the case of forming the multilayer wiring structural body, and an antenna formation step of patterning the metal plate and forming the antenna is provided.

In a related-art manufacturing method of a semiconductor device, a metal plate is used as a support plate in the case of forming the multiplayer wiring structural body by a build-up method in order form a thin wiring substrate, and after forming the multiplayer wiring structural body, the metal plate is removed. However, according to the one or more embodiments of the invention, by patterning a metal plate used as a support plate in the case of forming a multilayer wiring structural body and forming an antenna, the need for a step of removing the metal plate after forming the multilayer wiring structural body is eliminated, so that the number of manufacturing steps of a wiring substrate can be reduced, so that a manufacturing cost of a semiconductor device can be reduced.

According to a further standpoint of one or more embodiments of the invention, a manufacturing method of a semiconductor device, including a multilayer wiring structural body having a wiring pattern and an insulating layer laminated, an antenna disposed on one surface of the multilayer wiring structural body, and an electronic component which is disposed on the other surface opposite to the one surface of the multilayer wiring structural body and is electrically connected to the multilayer wiring structural body, the manufacturing method characterized by comprising a metal plate preparation step of preparing first and second metal plates used as support plates in the case of forming the multilayer wiring structural bodies, a metal plate pasting step of pasting the first metal plate to the second metal plate so as to oppose a surface opposite to a surface of the first metal plate on which the multilayer wiring structural body is formed to a surface opposite to a surface of the second metal plate on which the multilayer wiring structural body is formed, a multilayer wiring structural body formation step of simultaneously forming the multilayer wiring structural bodies on the first and second metal plates, and an antenna formation step of patterning the first and second metal plates and forming the antennas in the first and second metal plates is provided.

According to the one or more embodiments of the invention, by disposing a multilayer wiring structural body formation step of forming multilayer wiring structural bodies on pasted first and second metal plates and an antenna formation step of patterning the first and second metal plates and forming antennas in the first and second metal plates, two wiring substrates can be manufactured at once, so that a manufacturing cost of a semiconductor device can be reduced.

One or more embodiments of the present invention may include one or more the following advantages a wiring substrate comprising a multilayer wiring structural body, an antenna and an electronic component disposed in the multilayer wiring structural body, and a semiconductor device comprising the wiring substrate are miniaturized and also, a manufacturing cost of the wiring substrate and the semiconductor device can be reduced.

Other features and advantages may be apparent from the following detailed description, the accompanying drawings and the claims.

BRIEF DESCRIPTION OF THE DRAWINGS

FIG. 35 is a diagram showing another example of a manufacturing step of the semiconductor device according to the second embodiment of the invention (sixth).

DETAILED DESCRIPTION

Next, embodiments of the invention will be described based on the drawings.

First Embodiment

Figure 1:
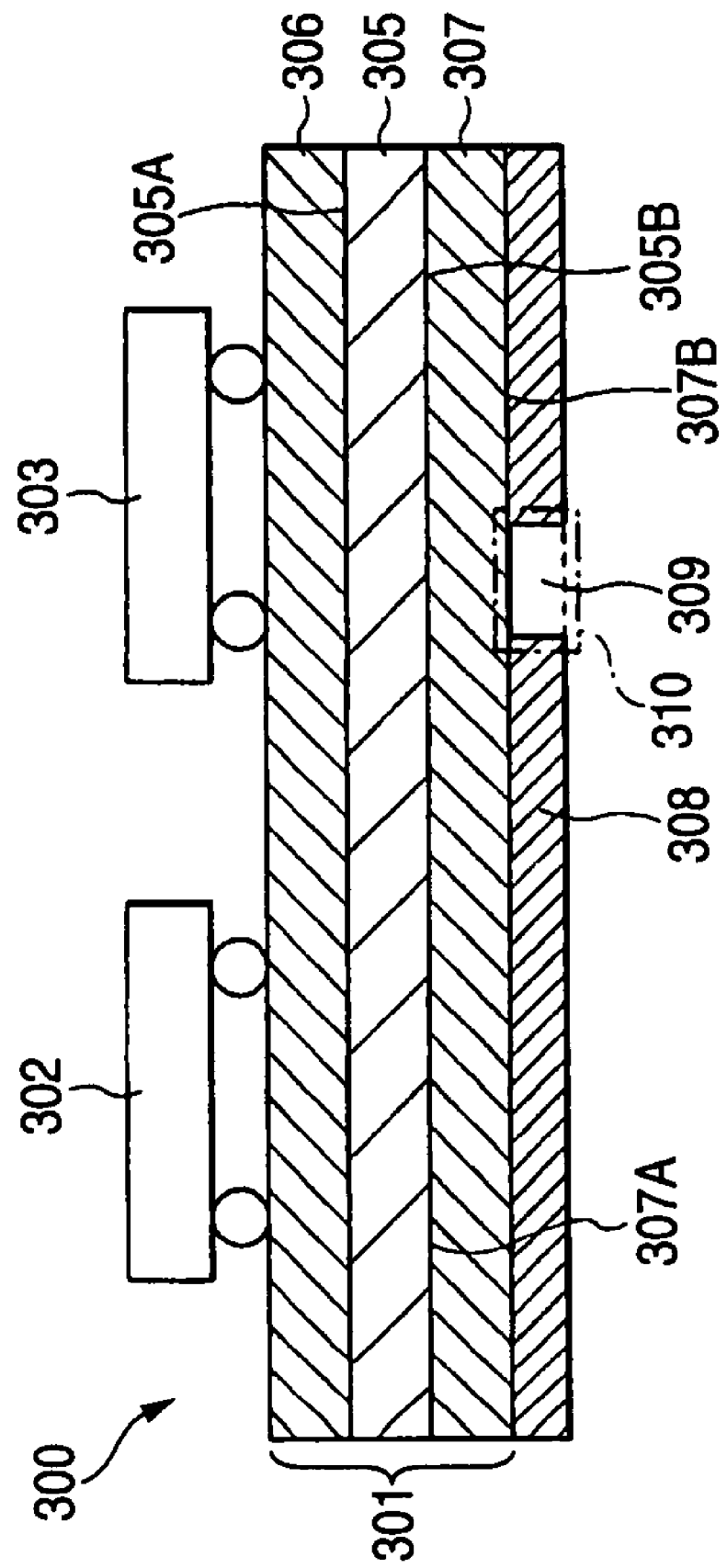
FIG. 1 is a sectional view of a related-art semiconductor device.
Figure 2:
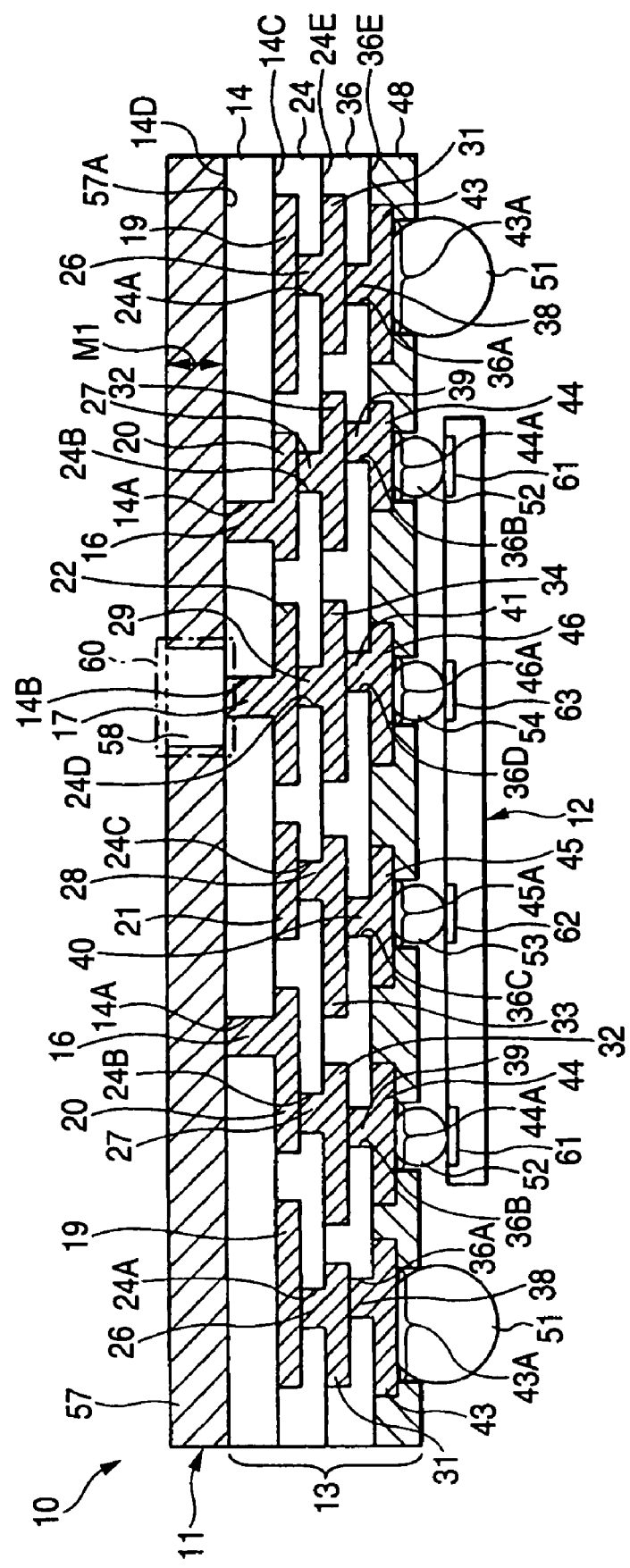
FIG. 2 is a sectional view of a semiconductor device according to a first embodiment of the invention.

FIG. 2 is a sectional view of a semiconductor device according to a first embodiment of the invention.

A semiconductor device 10 of the first embodiment will be described with reference to FIG. 2. In the present embodiment, a semiconductor device used in wireless communication equipment as the semiconductor device 10 will be described as an example.

The semiconductor device 10 has a wiring substrate 11 and an electronic component 12. The wiring substrate 11 is a coreless substrate, and has a multilayer wiring structural body 13, a first external connection terminal 51, second external connection terminals 52 to 54, a metal plate 57, and a slot antenna 60 which is an antenna.

The multilayer wiring structural body 13 has insulating layers 14, 24, 36, first vias 16, 17, first wirings 19 to 22, second vias 26 to 29, second wirings 31 to 34, third vias 38 to 41, third wirings 43 to 46, and a protective film 48.

The insulating layer 14 is disposed so as to cover a surface 57A of the metal plate 57. The insulating layer 14 has openings 14A, 14B. The opening 14A is formed so as to expose a part of the surface 57A of the metal plate 57. The opening 14B is formed so as to extend through the insulating layer 14 corresponding to a formation position of a groove 58 disposed in the metal plate 57. As the insulating layer 14, for example, a resin layer can be used. As a material of the resin layer, for example, an epoxy resin or a polyimide resin can be used.

The first via 16 is disposed in the opening 14A. The first via 16 is in contact with the metal plate 57. The first via 17 is disposed in the opening 14B. The first via 17 is electrically connected to a pad 63 for signal of the electronic component 12. One end of the first via 17 is exposed to the groove 58. As a material of the first vias 16, 17, for example, a conductive metal can be used. Also, as the conductive metal, for example, Cu can be used.

The first wirings 19 to 22 are disposed on a surface 14C of the insulating layer 14. The first wiring 19 is electrically connected to the first external connection terminal 51. The first wiring 20 is constructed integrally with the first via 16. The first wiring 20 is electrically connected to the metal plate 57 through the first via 16. The first wiring 20 is electrically connected to a pad 61 for ground of the electronic component 12. The first wiring 21 is electrically connected to a pad 62 for power source of the electronic component 12. The first wiring 22 is constructed integrally with the first via 17. As a material of the first wirings 19 to 22, for example, a conductive metal can be used. Also, as the conductive metal, for example, Cu can be used.

The insulating layer 24 is disposed on the surface 14C of the insulating layer 14 so as to cover the first wirings 19 to 22. The insulating layer 24 has an opening 24A for exposing a part of the first wiring 19, an opening 24B for exposing a part of the first wiring 20, an opening 24C for exposing a part of the first wiring 21 and an opening 24D for exposing a part of the first wiring 22. As the insulating layer 24, for example, a resin layer can be used. As a material of the resin layer, for example, an epoxy resin or a polyimide resin can be used.

The second via 26 is disposed in the opening 24A and is in contact with the first wiring 19. The second via 27 is disposed in the opening 24B. The second via 27 is in contact with the first wiring 20 and is electrically connected to the metal plate 57. The second via 28 is disposed in the opening 24C. The second via 28 is in contact with the first wiring 21. The second via 29 is disposed in the opening 24D. As a material of the second vias 26 to 29, for example, a conductive metal can be used. Also, as the conductive metal, for example, Cu can be used.

The second wirings 31 to 34 are disposed on a surface 24E of the insulating layer 24. The second wiring 31 is constructed integrally with the second via 26. The second wiring 32 is constructed integrally with the second via 27. The second wiring 33 is constructed integrally with the second via 28. The second wiring 34 is constructed integrally with the second via 29. As a material of the second wirings 31 to 34, for example, a conductive metal can be used. Also, as the conductive metal, for example, Cu can be used.

The insulating layer 36 is disposed on the surface 24E of the insulating layer 24 so as to cover the second wirings 31 to 34. The insulating layer 36 has an opening 36A for exposing a part of the second wiring 31, an opening 36B for exposing a part of the second wiring 32, an opening 36C for exposing a part of the second wiring 33 and an opening 36D for exposing a part of the second wiring 34. As the insulating layer 36, for example, a resin layer can be used. As a material of the resin layer, for example, an epoxy resin or a polyimide resin can be used.

The third via 38 is disposed in the opening 36A. The third via 38 is in contact with the second wiring 31. The third via 39 is disposed in the opening 36B. The third via 39 is in contact with the second wiring 32. The third via 40 is disposed in the opening 36C. The third via 40 is in contact with the second wiring 33. The third via 41 is disposed in the opening 36D. The third via 41 is in contact with the second wiring 34. As a material of the third vias 38 to 41, for example, a conductive metal can be used. Also, as the conductive metal, for example, Cu can be used.

The third wirings 43 to 46 are disposed on a surface 36E of the insulating layer 36. The third wiring 43 is constructed integrally with the third via 38. The third wiring 43 has a connection part 43A to which the first external connection terminal 51 is connected. The third wiring 44 is constructed integrally with the third via 39. The third wiring 44 has a connection part 44A to which the second external connection terminal 52 is connected.

The third wiring 45 is constructed integrally with the third via 40. The third wiring 45 has a connection part 45A to which the second external connection terminal 53 is connected. The third wiring 46 is constructed integrally with the third via 41. The third wiring 46 has a connection part 46A to which the second external connection terminal 54 is connected. As a material of the third wirings 43 to 46, for example, a conductive metal can be used. Also, as the conductive metal, for example, Cu can be used.

The protective film 48 is disposed on the surface 36E of the insulating layer 36 so as to cover the third wirings 43 to 46. The protective film 48 is a film for protecting the third wirings 43 to 46. The protective film 48 has openings for exposing the connection parts 43A to 46A. As the protective film 48, for example, a solder resist can be used.

The first external connection terminal 51 is disposed in the connection part 43A. The first external connection terminal 51 is a terminal for electrically connecting the wiring substrate 11 to a mounting board (not shown) such as a motherboard. As the first external connection terminal 51, for example, a solder ball can be used.

The second external connection terminal 52 is disposed in the connection part 44A. The second external connection terminal 52 is connected to the pad 61 for ground of the electronic component 12. Consequently, the pad 61 for ground is electrically connected to the metal plate 57. That is, the metal plate 57 is set at a ground potential. The second external connection terminal 53 is disposed in the connection part 45A. The second external connection terminal 53 is connected to the pad 62 for power source of the electronic component 12.

The second external connection terminal 54 is disposed in the connection part 46A. The second external connection terminal 54 is connected to the pad 63 for signal of the electronic component 12. Consequently, the first via 17 is electrically connected to the pad 63 for signal.

The metal plate 57 is disposed so as to cover a surface 14D of the insulating layer 14. The metal plate 57 is set at a ground potential, and functions as a ground layer. Also, the metal plate 57 functions as a support plate in the case of forming the multilayer wiring structural body 13. As the metal plate 57, for example, metal foil can be used. As the metal foil, for example, Cu foil can be used. A thickness M1 of the metal plate 57 can be set at, for example, 20 to 30 µm.

Figure 3:
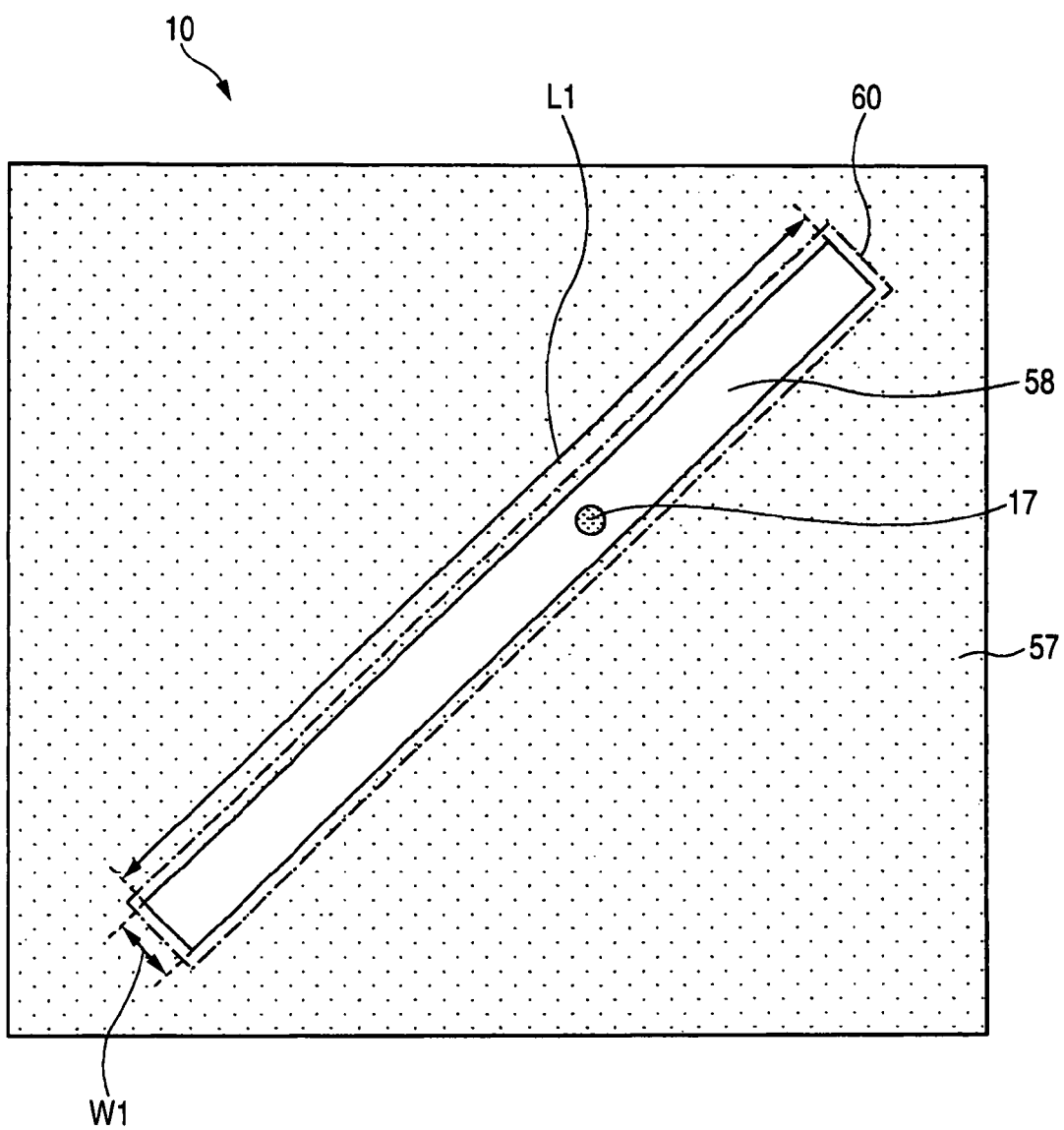
FIG. 3 is a diagram viewing the semiconductor device shown in FIG. 2 from the plane.

FIG. 3 is a diagram viewing the semiconductor device shown in FIG. 2 from the plane.

Referring to FIG. 3, the slot antenna 60 is disposed in the metal plate 57. The slot antenna 60 is constructed by a groove 58 formed in the metal plate 57, and the metal plate 57 corresponding to a side wall of the groove 58. The slot antenna 60 functions as an antenna at the time when a current flowing into the first via 17 electrically connected to the pad 63 for signal of the electronic component 12 is supplied to the groove 58.

When the semiconductor device 10 is a semiconductor device used in a band of a frequency of 2.4 GHz, for example, a width W1 of the groove 58 can be set at 0.5 to 1.0 mm and a length L1 of the groove 58 can be set at 20 mm.

Referring to FIG. 2, the electronic component 12 has the pad 61 for ground connected to the second external connection terminal 52, the pad 62 for power source connected to the second external connection terminal 53 and the pad 63 for signal connected to the second external connection terminal 54. Flip chip connection between the electronic component 12 and the wiring substrate 11 is made by the second external connection terminals 52 to 54. As the electronic component 12, for example, a semiconductor chip equipped with a configuration of an RFIC (concretely, a circuit for generating a signal) and a control circuit for controlling a signal from the RFIC can be used.

According to the semiconductor device of the embodiment, by disposing the slot antenna 60 on a surface opposite to a surface to which the electronic component 12 is connected of the multilayer wiring structural body 13, a size in a surface direction of the wiring substrate 11 can be miniaturized as compared with the case of disposing the electronic component 12 and the slot antenna 60 on the same plane of the multilayer wiring structural body 13. Consequently, the semiconductor device 10 can be miniaturized.

Also, since the semiconductor device of the embodiment does not have a core substrate, a length of a power feeding line (power feeding line constructed by the first to third vias 17, 29, 41 and the first to third wirings 22, 34, 46) for supplying a current for signal to the groove 58 of the slot antenna 60 is decreased (only substantially the thickness of the multilayer wiring structural body 13 is required) with compared to the related-art semiconductor device having a core substrate. Thus, transmission loss in the power feeding line can be reduced.

In addition, in the embodiment, the case where the number of laminations of the multilayer wiring structural body 13 disposed in the wiring substrate 11 (the number of laminations of wirings and insulating layers) is three layers has been described as an example, but the number of laminations of the multilayer wiring structural body 13 may be two layers or may be three layers or more.

Figure 6:
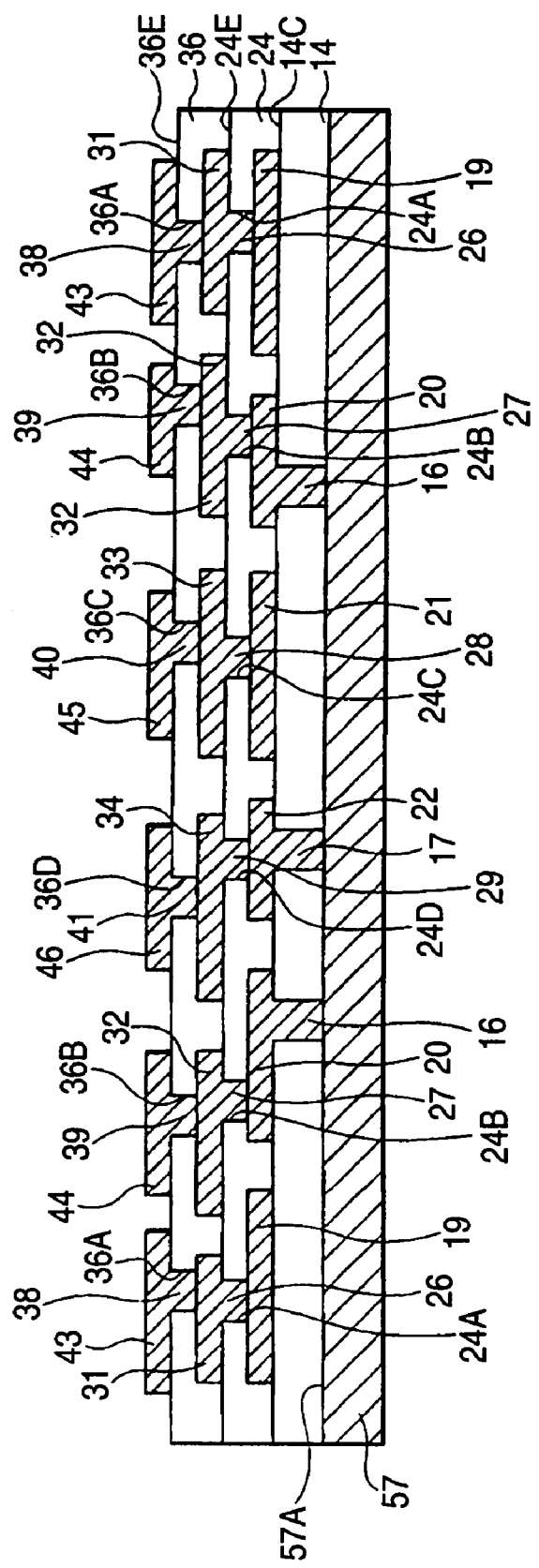
FIG. 6 is a diagram showing a manufacturing step of the semiconductor device according to the first embodiment of the invention (third).
Figure 7:
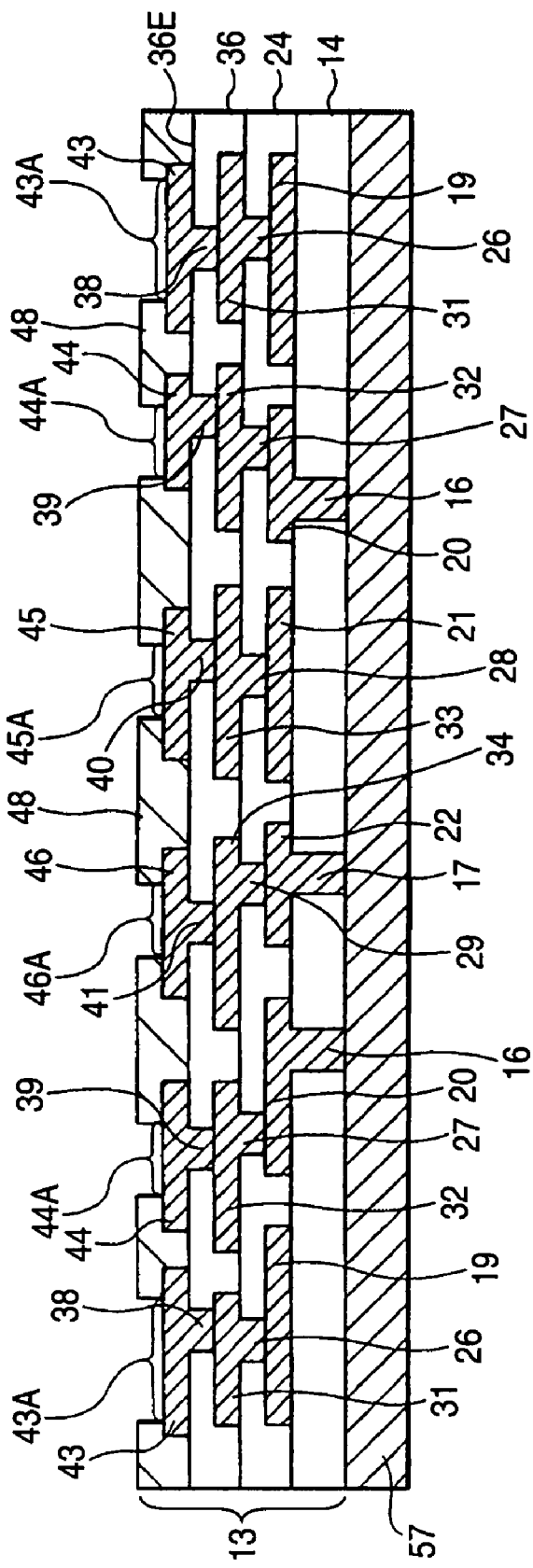
FIG. 7 is a diagram showing a manufacturing step of the semiconductor device according to the first embodiment of the invention (fourth).
Figure 8:
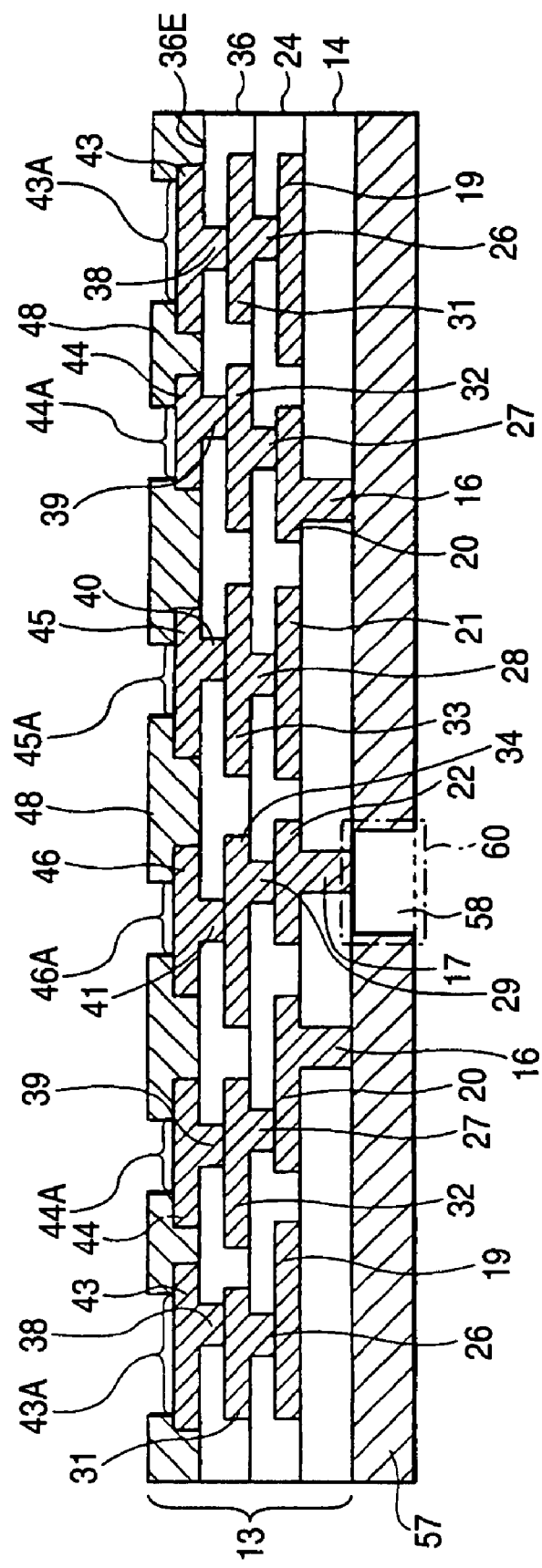
FIG. 8 is a diagram showing a manufacturing step of the semiconductor device according to the first embodiment of the invention (fifth).
Figure 9:
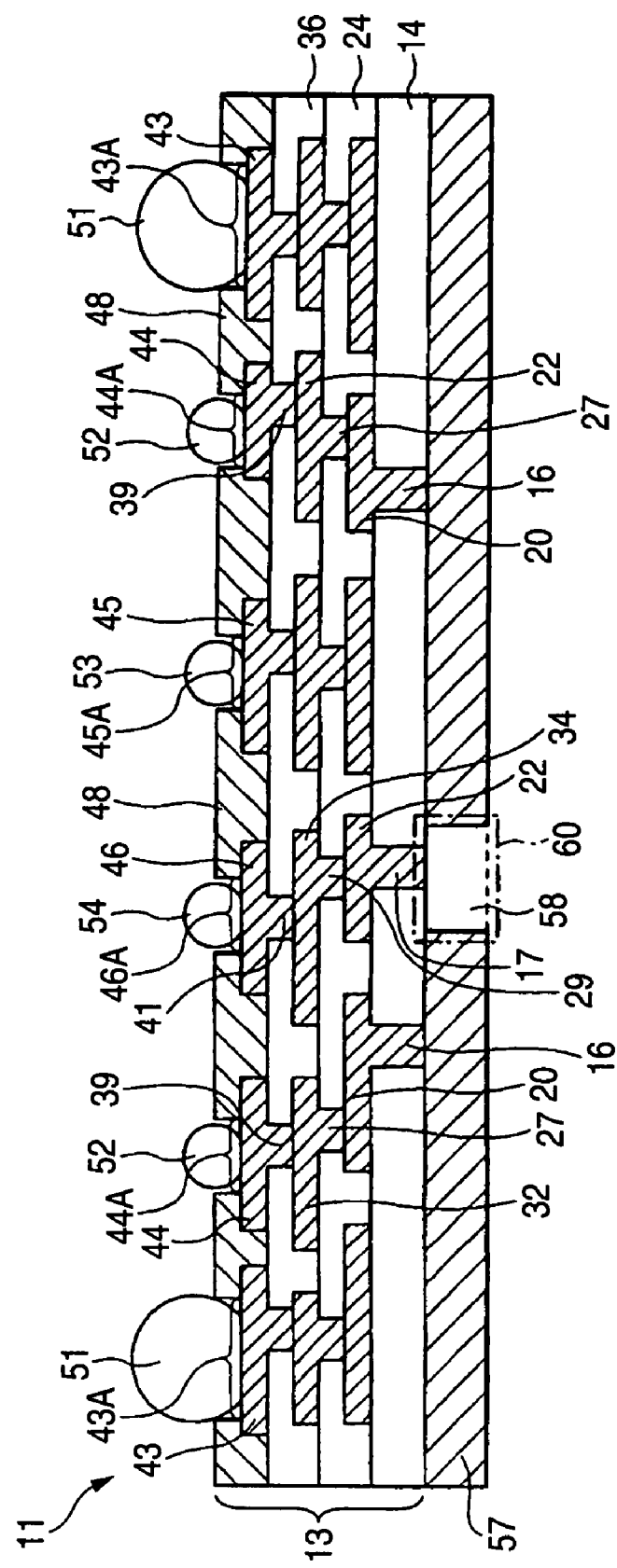
FIG. 9 is a diagram showing a manufacturing step of the semiconductor device according to the first embodiment of the invention (sixth).
Figure 10:
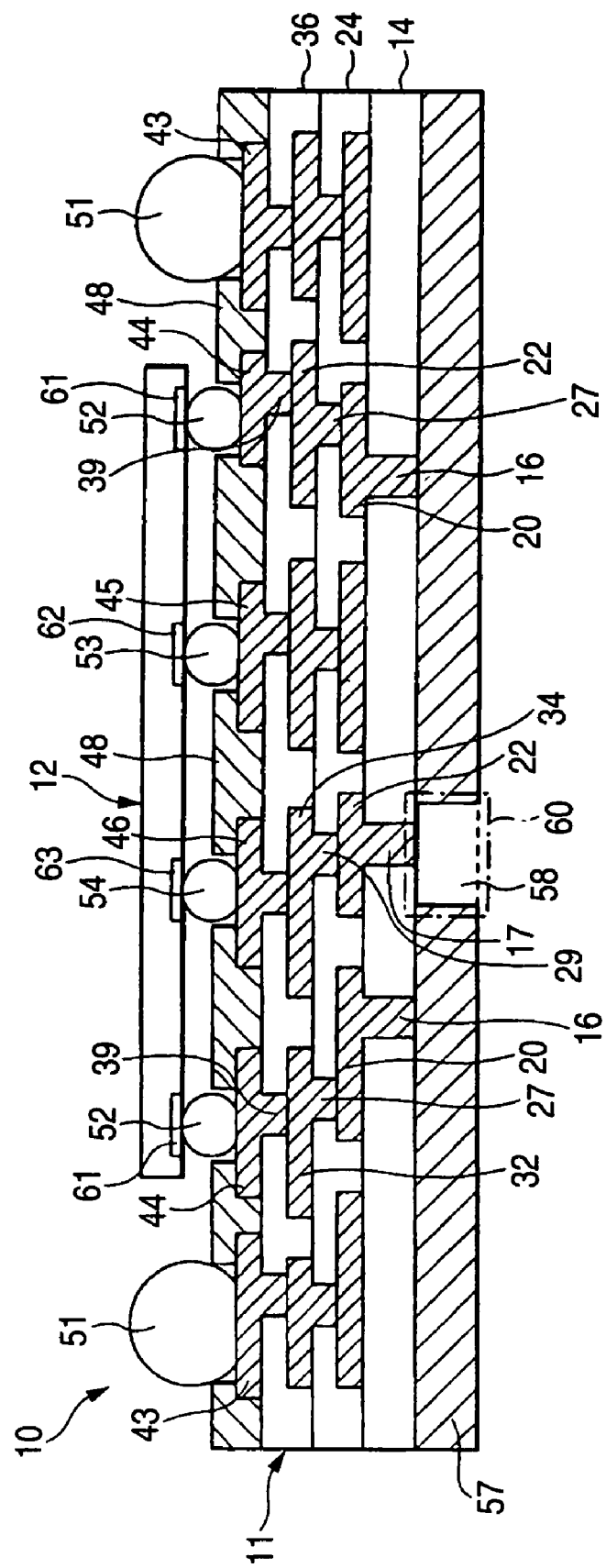
FIG. 10 is a diagram showing a manufacturing step of the semiconductor device according to the first embodiment of the invention (seventh).
Figure 11:
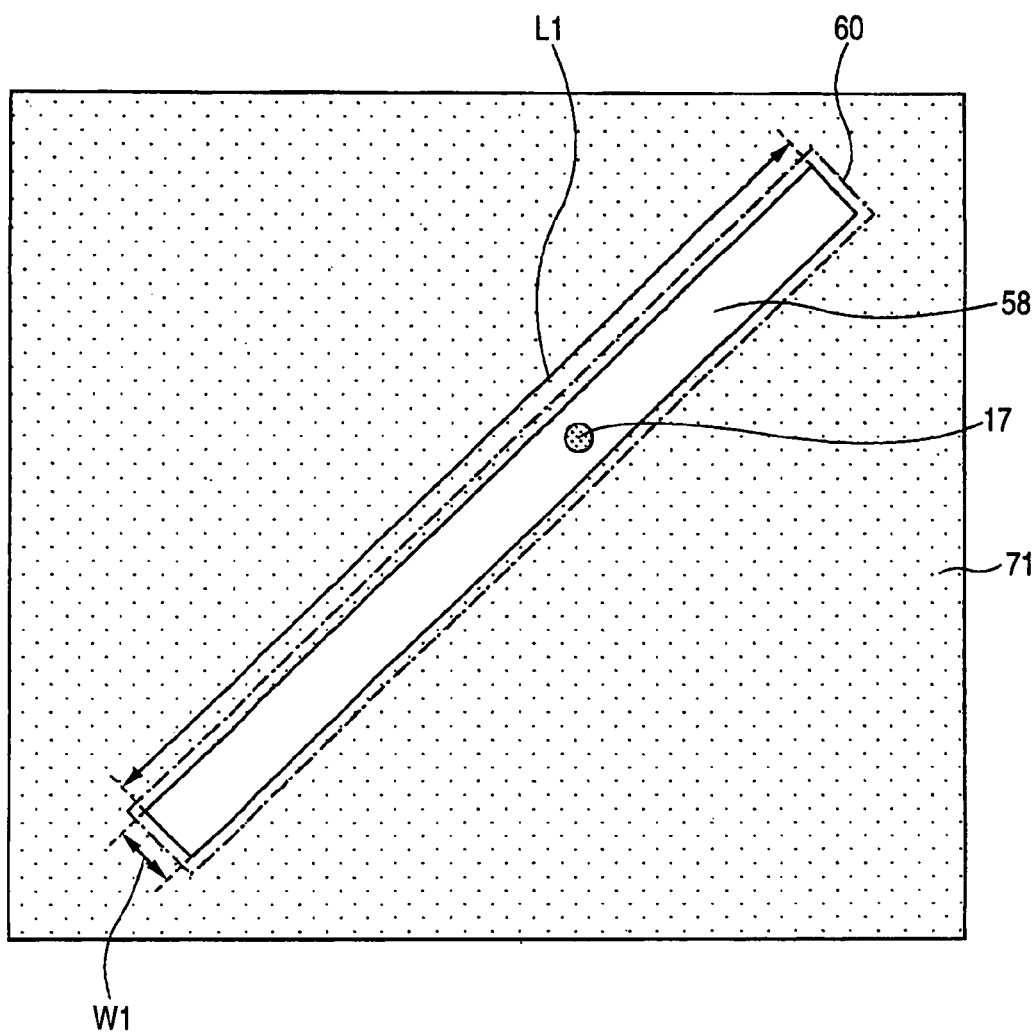
FIG. 11 is a diagram viewing a structural body shown in FIG. 8 from the plane.

FIGS. 4 to 10 are diagrams showing manufacturing steps of the semiconductor device according to the first embodiment of the invention, and FIG. 11 is a diagram viewing a structural body shown in FIG. 8 from the plane. In FIGS. 4 to 11, the same numerals are assigned to the same component portions as those of the semiconductor device 10 of the first embodiment.

A manufacturing method of the semiconductor device 10 according to the first embodiment of the invention will be described with reference to FIGS. 4 to 11.

Figure 4:
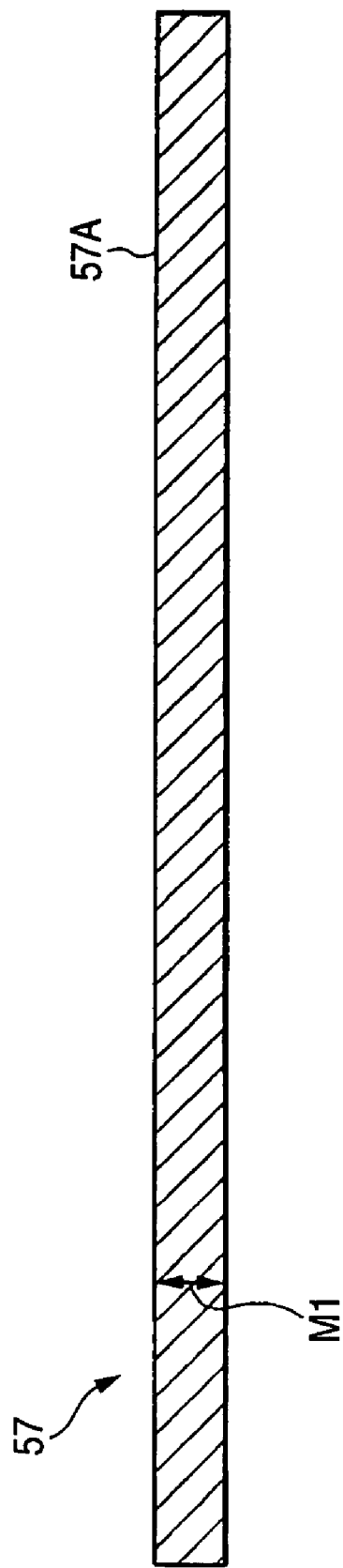
FIG. 4 is a diagram showing a manufacturing step of the semiconductor device according to the first embodiment of the invention (first).

First, in a step shown in FIG. 4, a metal plate 57 used as a support plate in the case of forming a multilayer wiring structural body 13 is prepared. As the metal plate 57, for example, metal foil can be used. As the metal foil, for example, Cu foil can be used. A thickness M1 of the metal plate 57 can be set at, for example, 20 to 30 μm.

Figure 5:
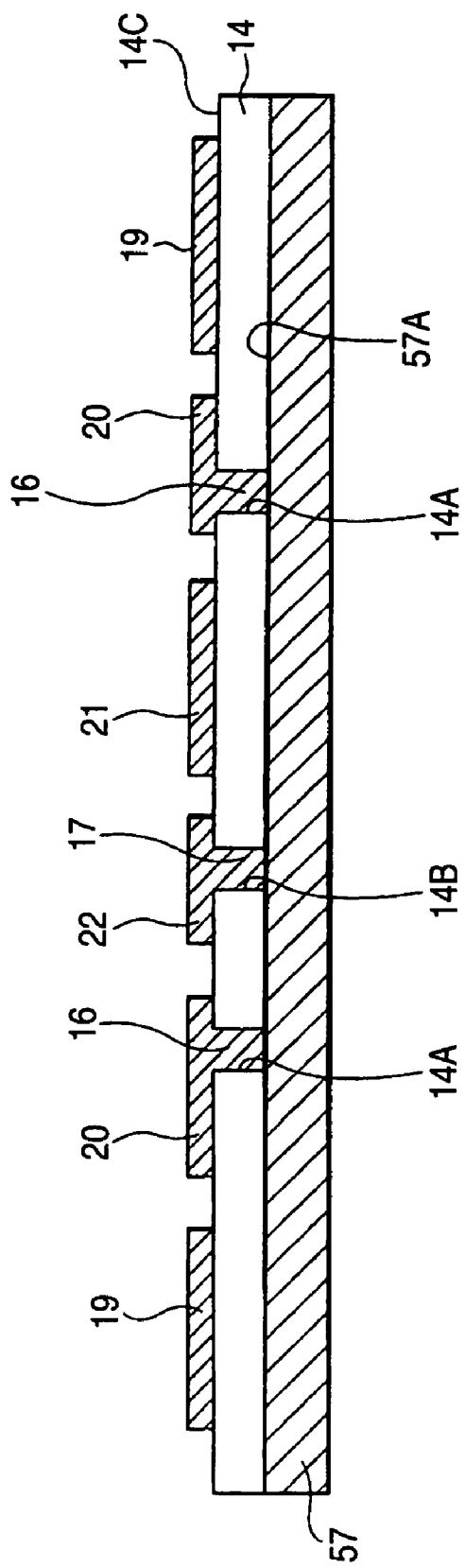
FIG. 5 is a diagram showing a manufacturing step of the semiconductor device according to the first embodiment of the invention (second).

Next, in a step shown in FIG. 5, an insulating layer 14 having openings 14A, 14B is formed on a surface 57A of the metal plate 57 and thereafter, first vias 16, 17 and first wirings 19 to 22 are formed.

Concretely, for example, a resin layer is formed on the surface 57A of the metal plate 57 as the insulating layer 14 by sticking of a resin film and thereafter, the openings 14A, 14B are formed by laser machining. Then, a seed layer (not shown) is formed so as to cover the resin layer by electroless plating and a resist film having openings for exposing only formation regions of the first wirings 19 to 22 is formed on the seed layer. Subsequently, a conductive metal is precipitated and grown on the seed layer exposed from the openings by an electrolytic plating method using the seed layer as a power feeding layer. Thereafter, the first vias 16, 17 and the first wirings 19 to 22 are formed by removing the resist film and the seed layer covered with the resist film. As a material of the resin layer, for example, an epoxy resin or a polyimide resin can be used. As a material of the seed layer and the conductive metal, for example, Cu can be used.

Then, in a step shown in FIG. 6, insulating layers 24, 36, second and third vias 26 to 29, 38 to 41, and second and third wirings 31 to 34, 43 to 46 are formed on a structural body shown in FIG. 5 by a technique similar to the step shown in FIG. 5.

Then, as shown in FIG. 7, a protective film 48 having openings for exposing connection parts 43A to 46A of the third wirings 43 to 46 is formed on a structural body shown in FIG. 6. Consequently, the multilayer wiring structural body 13 is formed. Also, the steps shown in FIGS. 5 to 7 correspond to a multilayer wiring structural body formation step. As the protective film 48, for example, a solder resist can be used.

Then, in a step shown in FIG. 8, a groove 58 for exposing the first via 17 and the insulating layer 14 is formed in the metal plate 57 and a slot antenna 60 is formed in the metal plate 57 (an antenna formation step). Consequently, the multilayer wiring structural body 13 is formed on the metal plate 57 which is a support plate. The groove 58 is formed by, for example, anisotropic etching of the metal plate 57. As the anisotropic etching, wet etching or dry etching can be used.

By patterning the metal plate 57 used as the support plate in the case of forming the multilayer wiring structural body 13 and forming the slot antenna 60 thus, the need for a step of removing the metal plate 57 after forming the multilayer wiring structural body 13 is eliminated, so that the number of manufacturing steps of a wiring substrate 11 can be reduced, so that a manufacturing cost of the wiring substrate 11 can be reduced.

When the semiconductor device 10 is a semiconductor device used in a band of a frequency of 2.4 GHz, for example, a width W1 of the groove 58 can be set at 0.5 to 1.0 mm and a length L1 of the groove 58 can be set at 20 mm (see FIG. 11).

Then, in a step shown in FIG. 9, a first external connection terminal 51 is formed on the connection part 43A and second external connection terminals 52 to 54 are formed on the connection parts 43A to 46A. Consequently, the wiring substrate 11 is manufactured.

As the first external connection terminal 51, for example, a solder ball can be used. Also, as the second external connection terminals 52 to 54, for example, a solder bump can be used. When the solder ball is used as the first external connection terminal 51, the first external connection terminal 51 can be formed by, for example, a Super Jufit method (a registered trademark of Showa Denko K.K.). When the solder bump is used as the second external connection terminals 52 to 54, the second external connection terminals 52 to 54 can be formed by, for example, the Super Jufit method (the registered trademark of Showa Denko K.K.).

Then, in a step shown in FIG. 10, a pad 61 for ground, a pad 62 for power source and a pad 63 for signal of an electronic component 12 are connected to the second external connection terminals 52 to 54 of the wiring substrate 11 (flip chip connection). Consequently, the semiconductor device 10 comprising the wiring substrate 11 and the electronic component 12 is manufactured.

According to the manufacturing method of the semiconductor device of the embodiment, by patterning the metal plate 57 used as the support plate in the case of forming the multilayer wiring structural body 13 and forming the slot antenna 60, the need for a step of removing the metal plate 57 after forming the multilayer wiring structural body 13 is eliminated, so that the number of steps can be reduced, so that a manufacturing cost of the wiring substrate can be reduced.

In addition, the slot antenna 60 may be formed in the metal plate 57 before the multilayer wiring structural body 13 is formed. By forming the slot antenna 60 in the metal plate 57 before the multilayer wiring structural body 13 is formed thus, productivity of the semiconductor device 10 can be improved as compared with the case of forming the slot antenna 60 in the metal plate 57 after the multilayer wiring structural body 13 is formed.

Also, in the manufacturing method of the semiconductor device of the embodiment, the case of forming one multilayer wiring structural body 13 in one metal plate 57 has been described as an example, but plural semiconductor device 10 may be manufactured by forming plural multilayer wiring structural bodies 13 in one metal plate 57 and then mounting the electronic component 12 in each of the multilayer wiring structural bodies 13 and thereafter cutting the metal plate 57.

Figure 15:
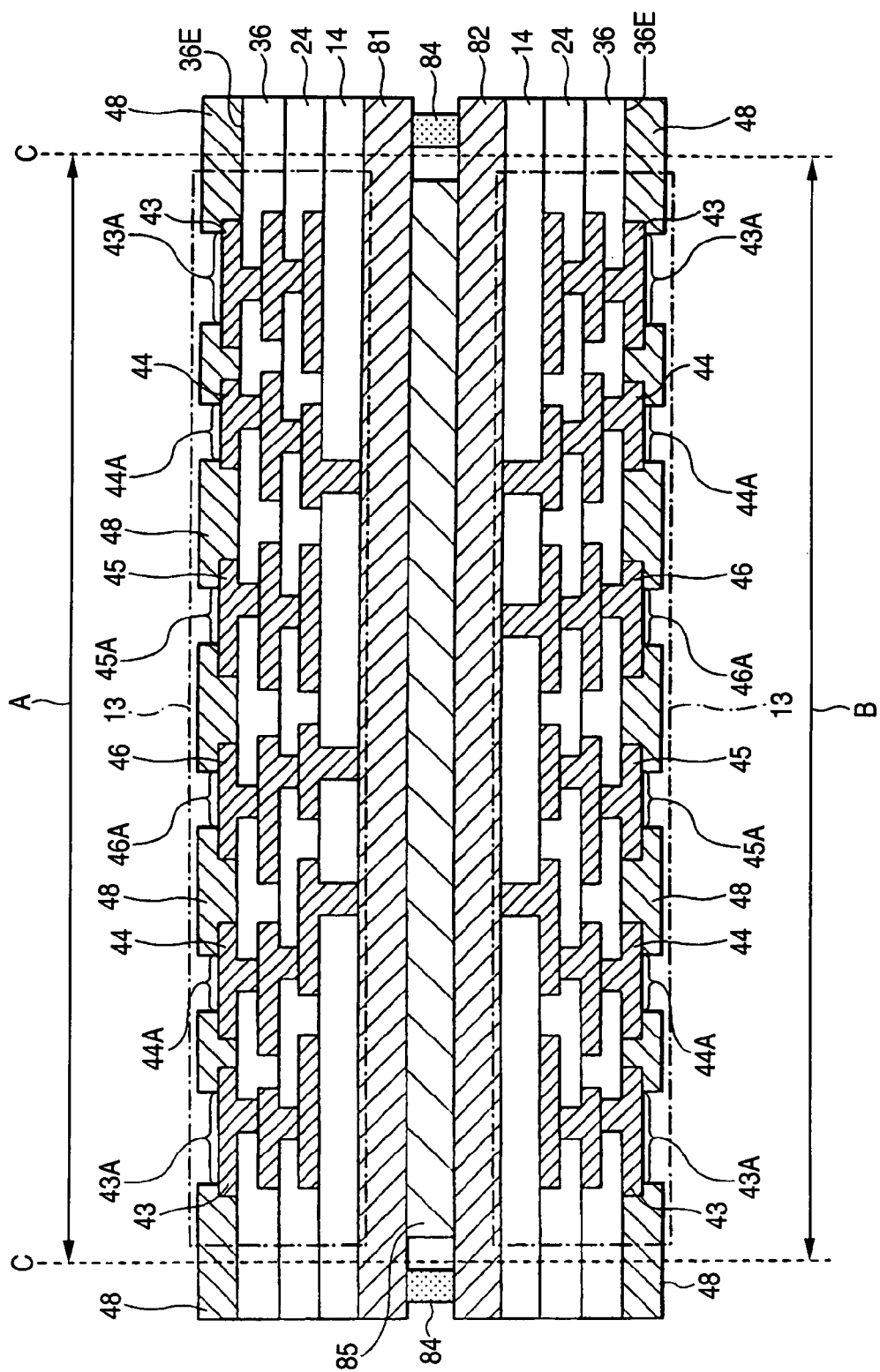
FIG. 15 is a diagram showing another example of a manufacturing step of the semiconductor device according to the first embodiment of the invention (fourth).
Figure 16:
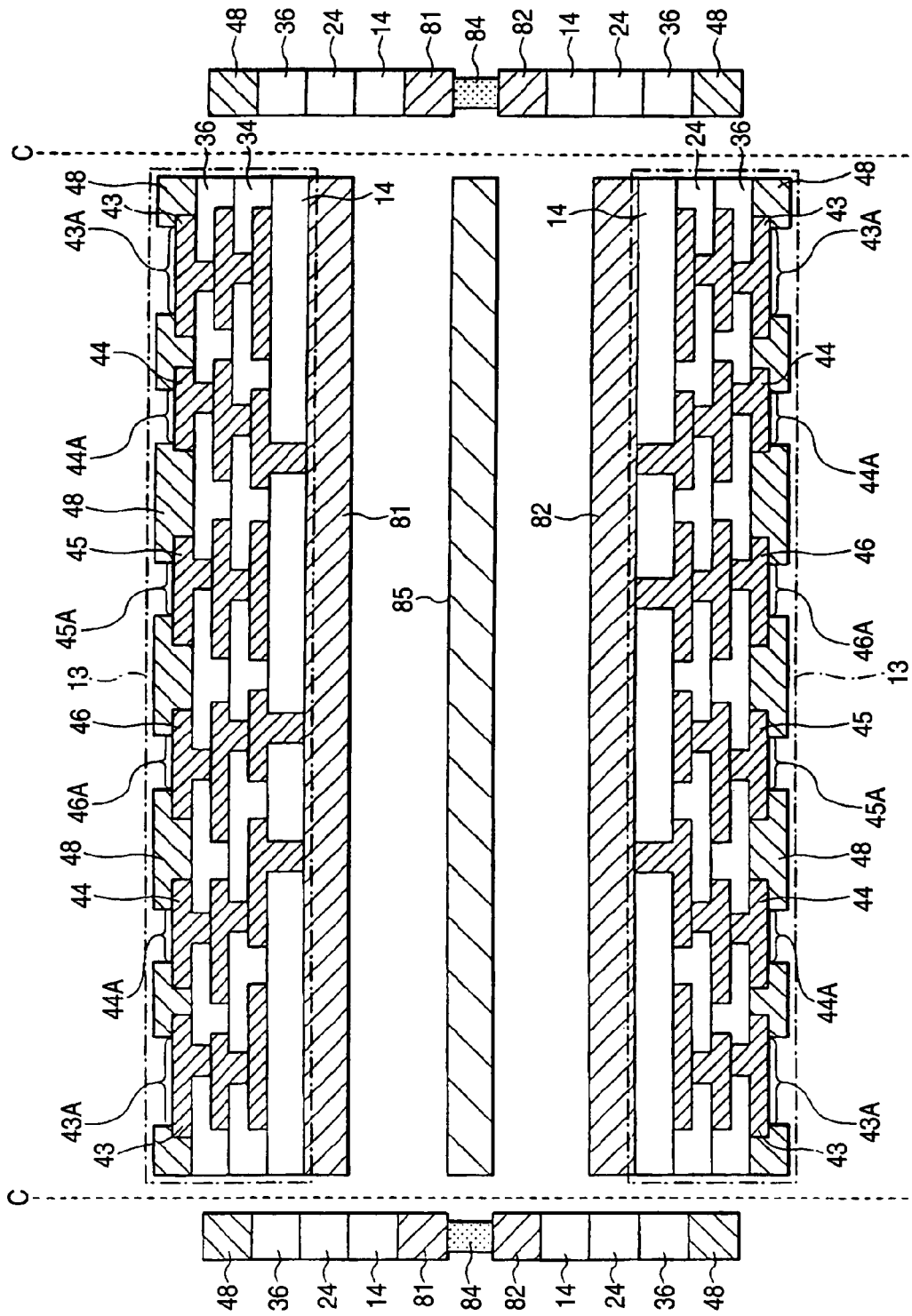
FIG. 16 is a diagram showing another example of a manufacturing step of the semiconductor device according to the first embodiment of the invention (fifth).
Figure 17:
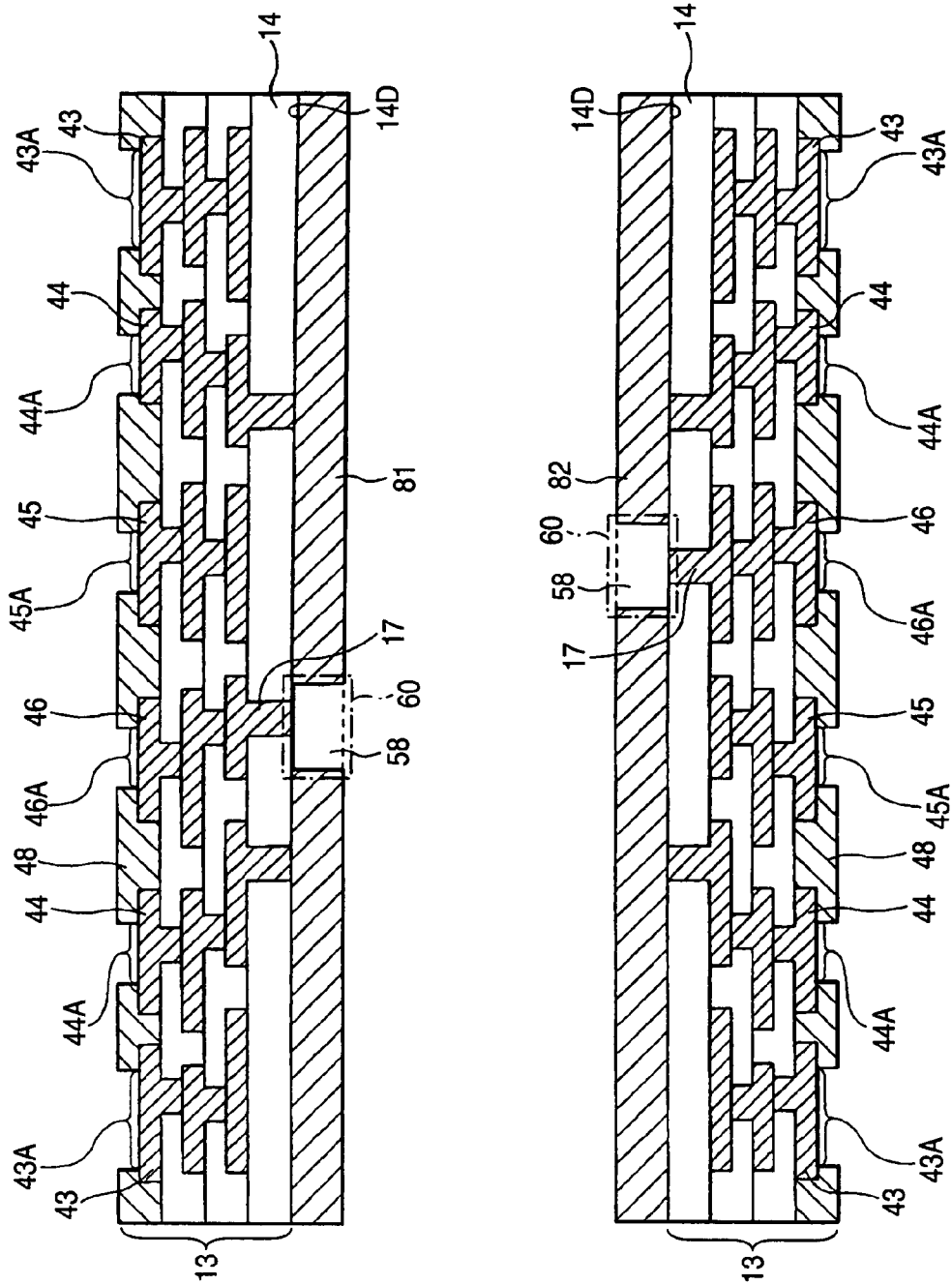
FIG. 17 is a diagram showing another example of a manufacturing step of the semiconductor device according to the first embodiment of the invention (sixth).

FIGS. 12 to 19 are diagrams showing another example of manufacturing steps of a semiconductor device according to the first embodiment of the invention. FIG. 20 is a diagram viewing a first metal plate in which a multilayer wiring structural body shown in FIG. 17 is formed from the plane. In FIGS. 12 to 20, the same numerals are assigned to the same component portions as those of the semiconductor device 10 of the first embodiment. Also, C shown in FIGS. 13 to 16 shows a cut position (hereinafter called "a cut position C") of first and second metal plates 81, 82.

Another example of a manufacturing method of the semiconductor device 10 of the first embodiment of the invention will be described with reference to FIGS. 12 to 20. The case of forming semiconductor device 10-1, 10-2 in the first and second metal plates 81, 82 will be described herein as an example. The semiconductor device 10-1, 10-2 are constructed in a manner similar to the semiconductor device 10 except that the first metal plate 81 or the second metal plate 82 is disposed instead of the metal plate 57 disposed in the semiconductor device 10. Also, in the following description, a wiring substrate disposed in the semiconductor device 10-1 is set at a wiring substrate 11-1 and a wiring substrate disposed in the semiconductor device 10-2 is set at a wiring substrate 11-2.

Figure 12:
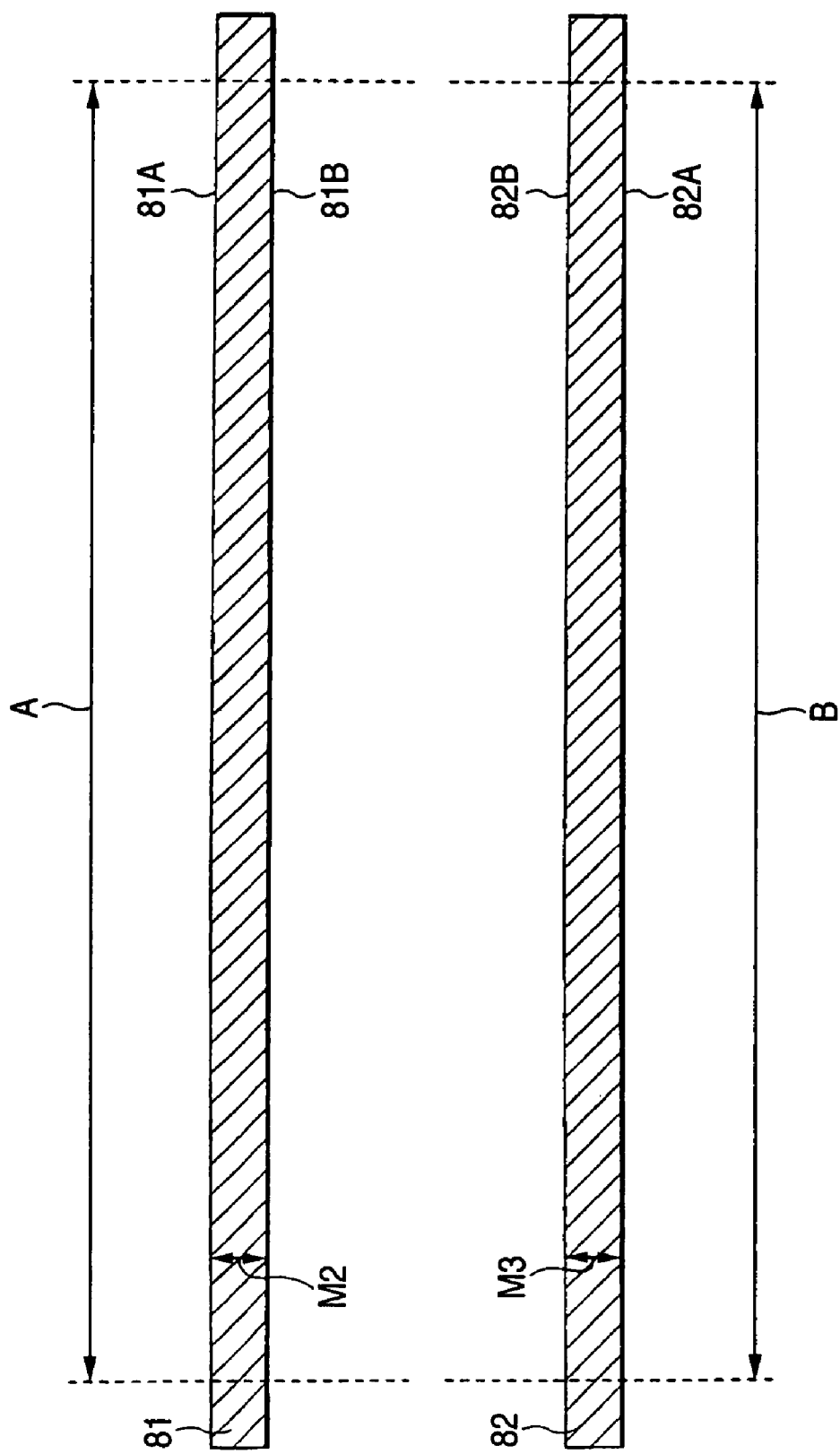
FIG. 12 is a diagram showing another example of a manufacturing step of the semiconductor device according to the first embodiment of the invention (first).

First, in a step shown in FIG. 12, the first metal plate 81 having a multilayer wiring structural body formation region A in which a multilayer wiring structural body 13 is formed and the second metal plate 82 having a multilayer wiring structural body formation region B in which a multilayer wiring structural body 13 is formed are prepared (a metal plate preparation step).

The first and second metal plates 81, 82 are used as support plates in the case of forming the multilayer wiring structural body 13. The first and second metal plates 81, 82 have a function similar to that of the metal plate 57 disposed in the semiconductor device 10. As the first and second metal plates 81, 82, for example, metal foil can be used. As the metal foil, for example, Cu foil can be used. Thicknesses M2, M3 of the first and second metal plates 81, 82 can be set at, for example, 20 to 30 μm.

Figure 13:
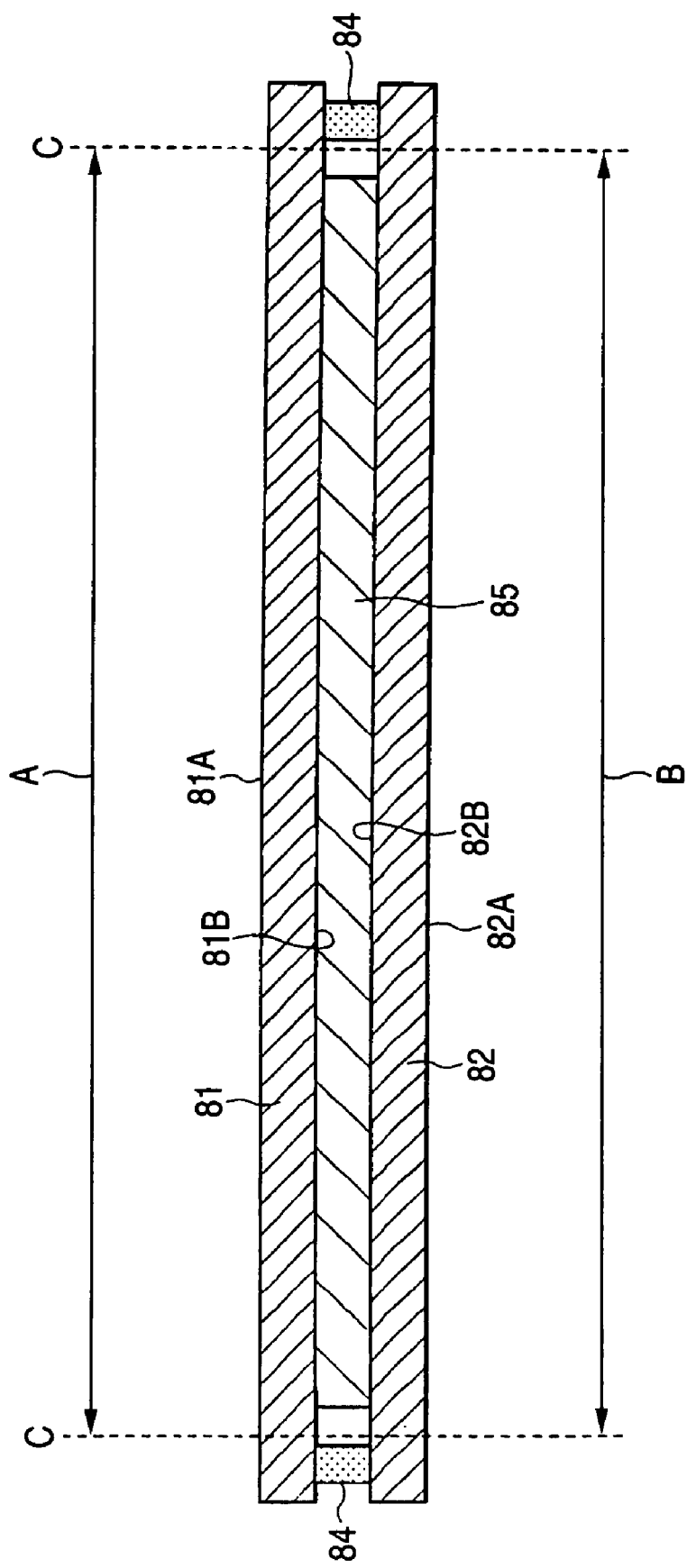
FIG. 13 is a diagram showing another example of a manufacturing step of the semiconductor device according to the first embodiment of the invention (second).

Next, in a step shown in FIG. 13, the first metal plate 81 is pasted to the second metal plate 82 by an adhesive 84 so as to oppose a second surface 81B (a surface of the side in which the multilayer wiring structural body 13 is not formed) of the first metal plate 81 to a second surface 82B (a surface of the side in which the multilayer wiring structural body 13 is not formed) of the second metal plate 82 through a reinforcing plate 85 such as a resin plate (a metal plate pasting step).

The adhesive 84 is disposed so as to surround the multilayer wiring structural body formation regions A, B. The reinforcing plate 85 is a plate for preventing the first and second metal plates 81, 82 from bending.

Figure 14:
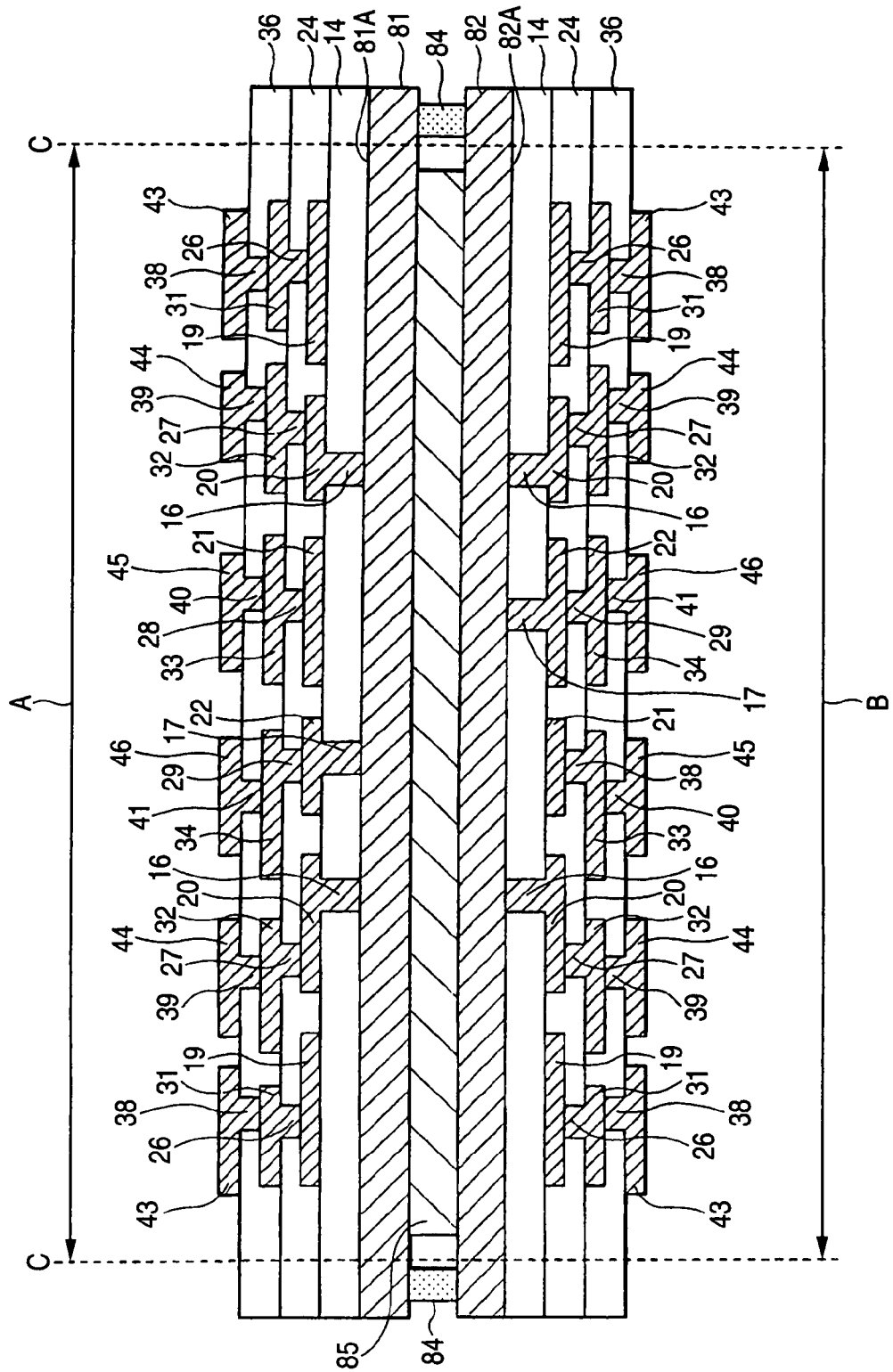
FIG. 14 is a diagram showing another example of a manufacturing step of the semiconductor device according to the first embodiment of the invention (third).

Then, in a step shown in FIG. 14, insulating layers 14, 24, 36, first to third vias 16, 17, 26 to 29, 38 to 41, and first to third wirings 19 to 22, 31 to 34, 43 to 46 are formed on first surfaces 81A, 82A of the first and second metal plates 81, 82 by a technique similar to the steps shown in FIGS. 5 and 6 described above.

Then, in a step shown in FIG. 15, protective films 48 having openings for exposing connection parts 43A to 46A of the third wirings 43 to 46 are formed on surfaces 36E of the insulating layers 36 of the first and second metal plates 81, 82. Consequently, the multilayer wiring structural bodies 13 are formed in the multilayer wiring structural body formation regions A, B of the first and second metal plates 81, 82.

Concretely, for example, a film-shaped solder resist is stuck so as to cover the third wirings 43 to 46 and the surfaces 36E of the insulating layers 36 as the protective films 48 and thereafter the film-shaped solder resist is exposed and developed and the openings for exposing connection parts 43A to 46A are formed. In addition, the steps shown in FIGS. 14 and 15 correspond to a multilayer wiring structural body formation step.

Then, in a step shown in FIG. 16, the first and second metal plates 81, 82 in which the multilayer wiring structural bodies 13 are formed are cut along the cut positions C (a metal plate cut step). Consequently, the first metal plate 81 in which the multilayer wiring structural body 13 is formed and the second metal plate 82 in which the multilayer wiring structural body 13 is formed are divided into individual pieces.

By pasting the first metal plate 81 to the second metal plate 82 and simultaneously forming the multilayer wiring structural bodies 13 on the first surfaces 81A, 82A of the first and second metal plates 81, 82 thus, the number of manufacturing steps of the wiring substrates 11-1, 11-2 becomes smaller than the case of separately forming the multilayer wiring structural bodies 13 on two metal plates, so that a manufacturing cost of the wiring substrates 11-1, 11-2 can be reduced.

Then, in a step shown in FIG. 17, grooves 58 for exposing the first vias 17 and surfaces 14D of the insulating layers 14 are formed in the first and second metal plates 81, 82. Consequently, slot antennas 60 are formed in the first and second metal plates 81, 82 functioning as ground layers (an antenna formation step).

The groove 58 can be formed by, for example, anisotropic etching. As the anisotropic etching, wet etching or dry etching can be used. When the semiconductor device 10 is a semiconductor device used in a band of a frequency of 2.4 GHz, for example, a width W1 of the groove 58 can be set at 0.5 to 1.0 mm and a length L1 of the groove 58 can be set at 20 mm (see FIG. 20).

By patterning the first and second metal plates 81, 82 used as support plates in the case of forming the multilayer wiring structural bodies 13 and forming the slot antennas 60 thus, the need for a step of removing the first and second metal plates 81, 82 is eliminated, so that the number of manufacturing steps of the wiring substrates 11-1, 11-2 can be reduced, so that a manufacturing cost of the wiring substrates 11-1, 11-2 can be reduced.

Figure 18:
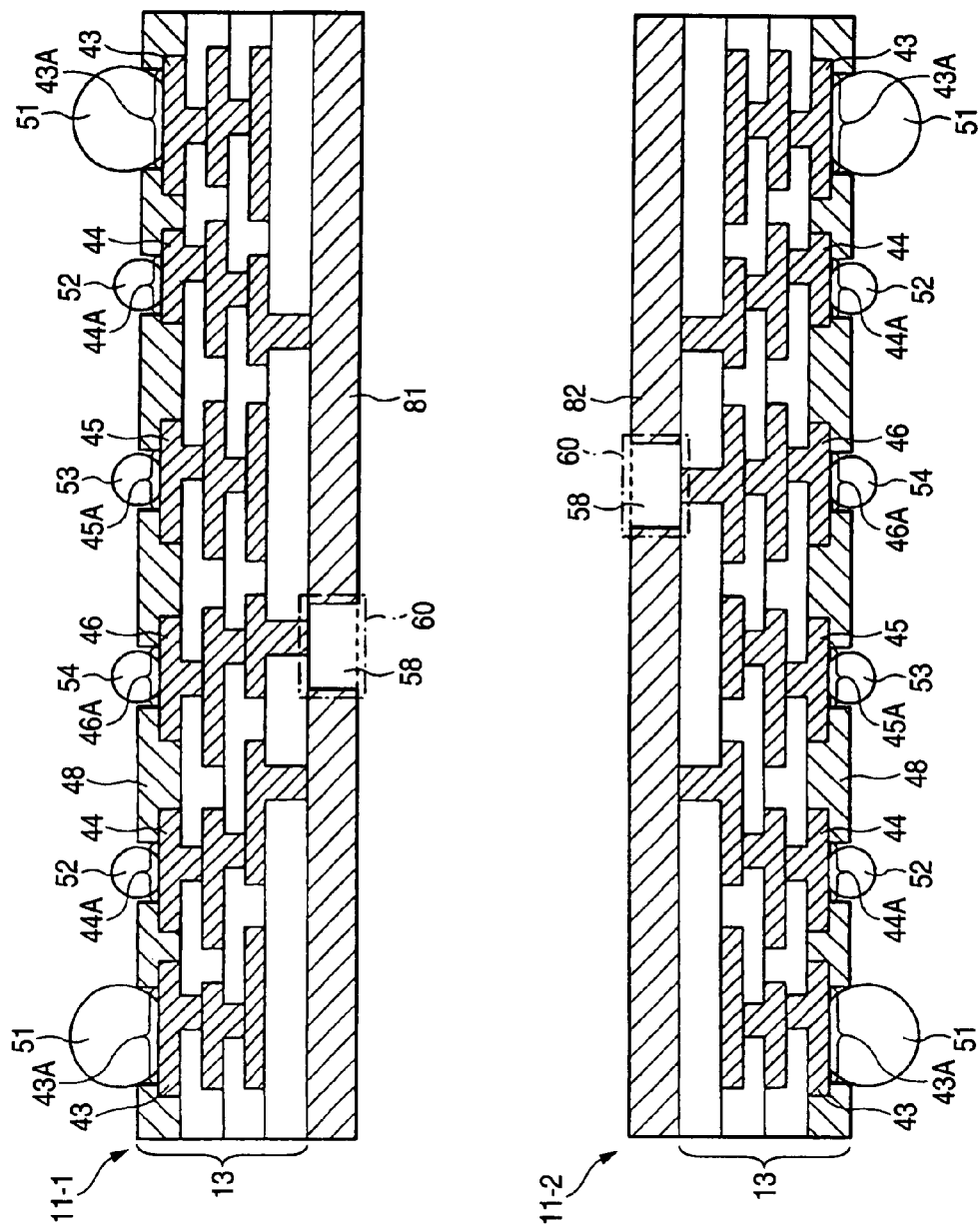
FIG. 18 is a diagram showing another example of a manufacturing step of the semiconductor device according to the first embodiment of the invention (seventh).

Then, in a step shown in FIG. 18, first external connection terminals 51 are formed on the connection parts 43A and second external connection terminals 52 to 54 are formed on the connection parts 44A to 46A. Consequently, the wiring substrates 11-1, 11-2 are formed. The wiring substrates 11-1, 11-2 are constructed in a manner similar to the wiring substrate 11 except that the first metal plate 81 or the second metal plate 82 is disposed instead of the metal plate 57 disposed in the wiring substrate 11 described in FIG. 2.

As the first external connection terminal 51, for example, a solder ball can be used. Also, as the second external connection terminals 52 to 54, for example, a solder bump can be used. When the solder ball is used as the first external connection terminal 51, the first external connection terminal 51 can be formed by, for example, a Super Jufit method (a registered trademark of Showa Denko K.K.). When the solder bump is used as the second external connection terminals 52 to 54, the second external connection terminals 52 to 54 can be formed by, for example, the Super Jufit method (the registered trademark of Showa Denko K.K.).

Figure 19:
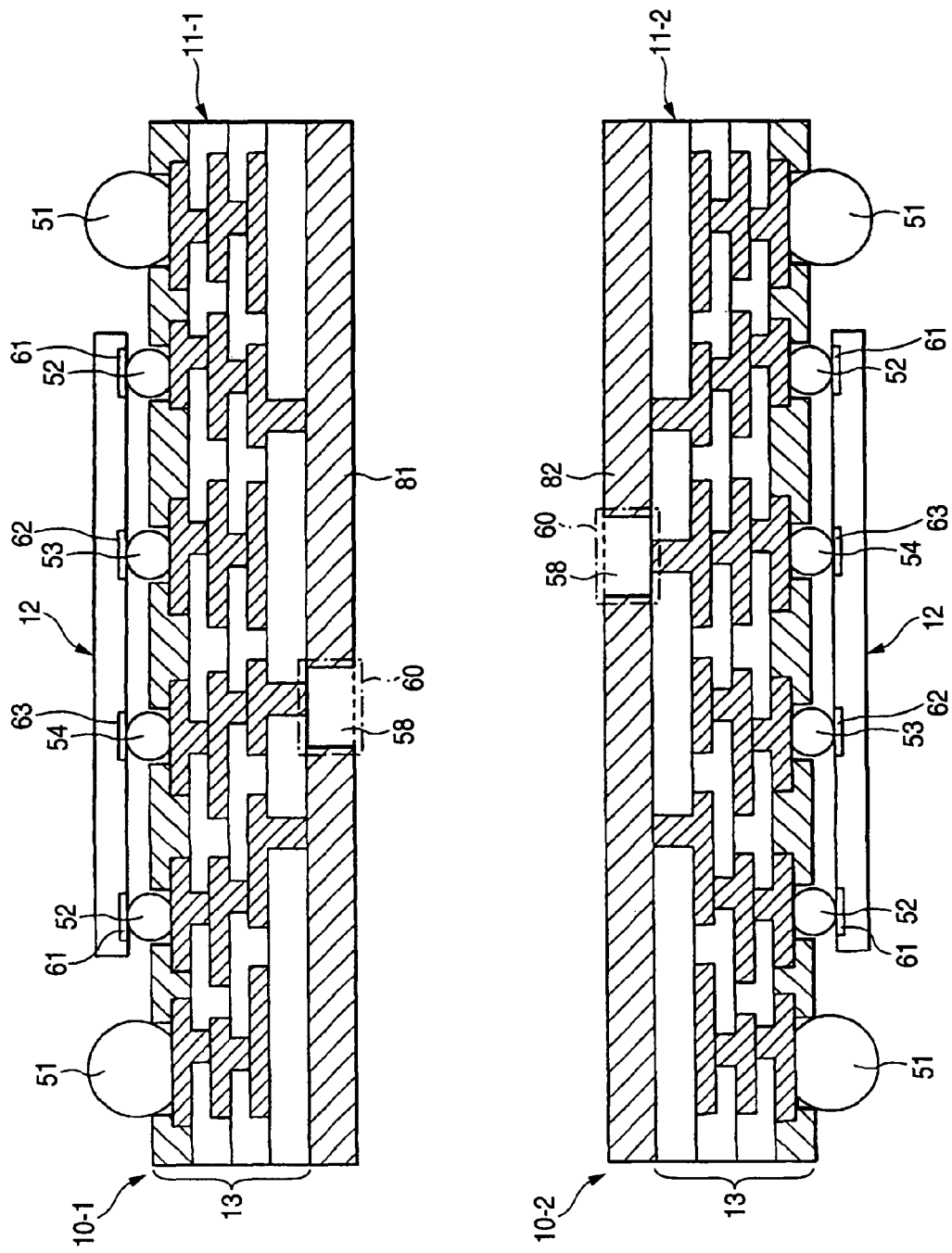
FIG. 19 is a diagram showing another example of a manufacturing step of the semiconductor device according to the first embodiment of the invention (eighth).
Figure 20:
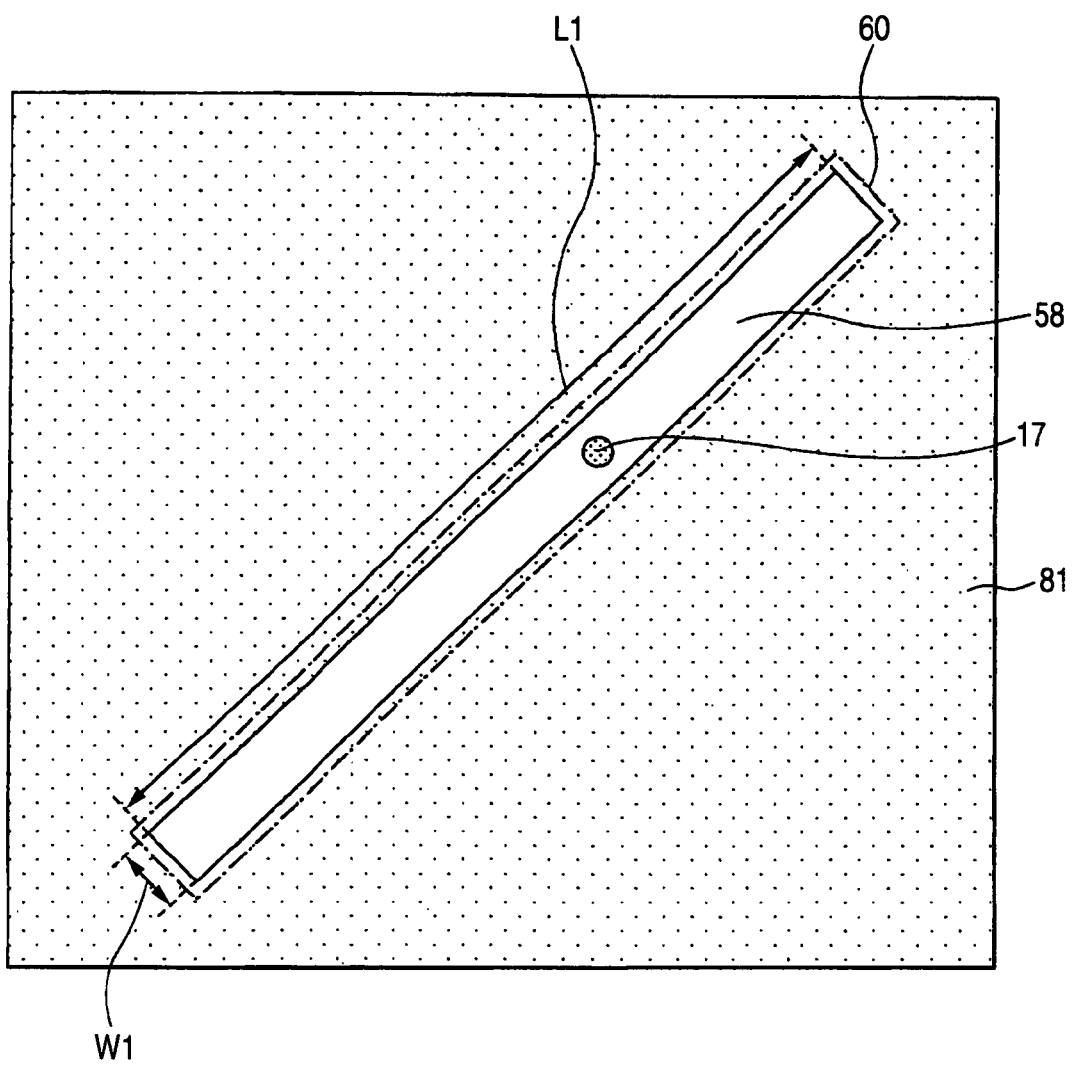
FIG. 20 is a diagram viewing a first metal plate in which a multilayer wiring structural body shown in FIG. 17 is formed from the plane.

Then, in a step shown in FIG. 19, pads 61 for ground, pads 62 for power source and pads 63 for signal of electronic components 12 are connected to the second external connection terminals 52 to 54 of the wiring substrates 11-1, 11-2 (flip chip connection).

Consequently, the semiconductor device 10-1 comprising the wiring substrate 11-1 and the electronic component 12 and the semiconductor device 10-2 comprising the wiring substrate 11-2 and the electronic component 12 are manufactured.

According to another manufacturing method of the semiconductor device of the embodiment, by pasting the first metal plate 81 to the second metal plate 82 and simultaneously forming the multilayer wiring structural bodies 13 on the first surfaces 81A, 82A of the first and second metal plates 81, 82, the number of manufacturing steps of the wiring substrates 11-1, 11-2 becomes smaller than the case of separately forming the multilayer wiring structural bodies 13 on two metal plates, so that a manufacturing cost of the semiconductor device 10-1, 10-2 can be reduced.

Also, by patterning the first and second metal plates 81, 82 used as support plates in the case of forming the multilayer wiring structural bodies 13 and forming the slot antennas 60, the need for a step of removing the first and second metal plates 81, 82 is eliminated, so that the number of manufacturing steps of the wiring substrates 11-1, 11-2 can be reduced, so that a manufacturing cost of the semiconductor device 10-1, 10-2 can be reduced.

In addition, the slot antennas 60 may be formed in the first and second metal plates 81, 82 before the multilayer wiring structural bodies 13 are formed. By forming the slot antennas 60 in the first and second metal plates 81, 82 before the multilayer wiring structural bodies 13 are formed thus, productivity of the semiconductor device 10-1, 10-2 can be improved as compared with the case of forming the slot antennas 60 in the first and second metal plates 81, 82 after the multilayer wiring structural bodies 13 are formed.

Also, in another example of the manufacturing method of the semiconductor device of the embodiment, the case of respectively forming one multilayer wiring structural body 13 in the first and second metal plates 81, 82 has been described as an example, but plural semiconductor device 10-1, 10-2 may be manufactured by respectively forming plural multilayer wiring structural bodies 13 in the first and second metal plates 81, 82 and thereafter cutting the first and second metal plates 81, 82 and mounting the electronic components 12 in each of the multilayer wiring structural bodies 13.

Further, in another example of the manufacturing method of the semiconductor device of the embodiment, the case of sticking the first metal plate 81 to the second metal plate 82 through the reinforcing plate 85 has been described as an example, but the semiconductor device 10-1, 10-2 may be manufactured by directly pasting the first metal plate 81 to the second metal plate 82.

Figure 21:
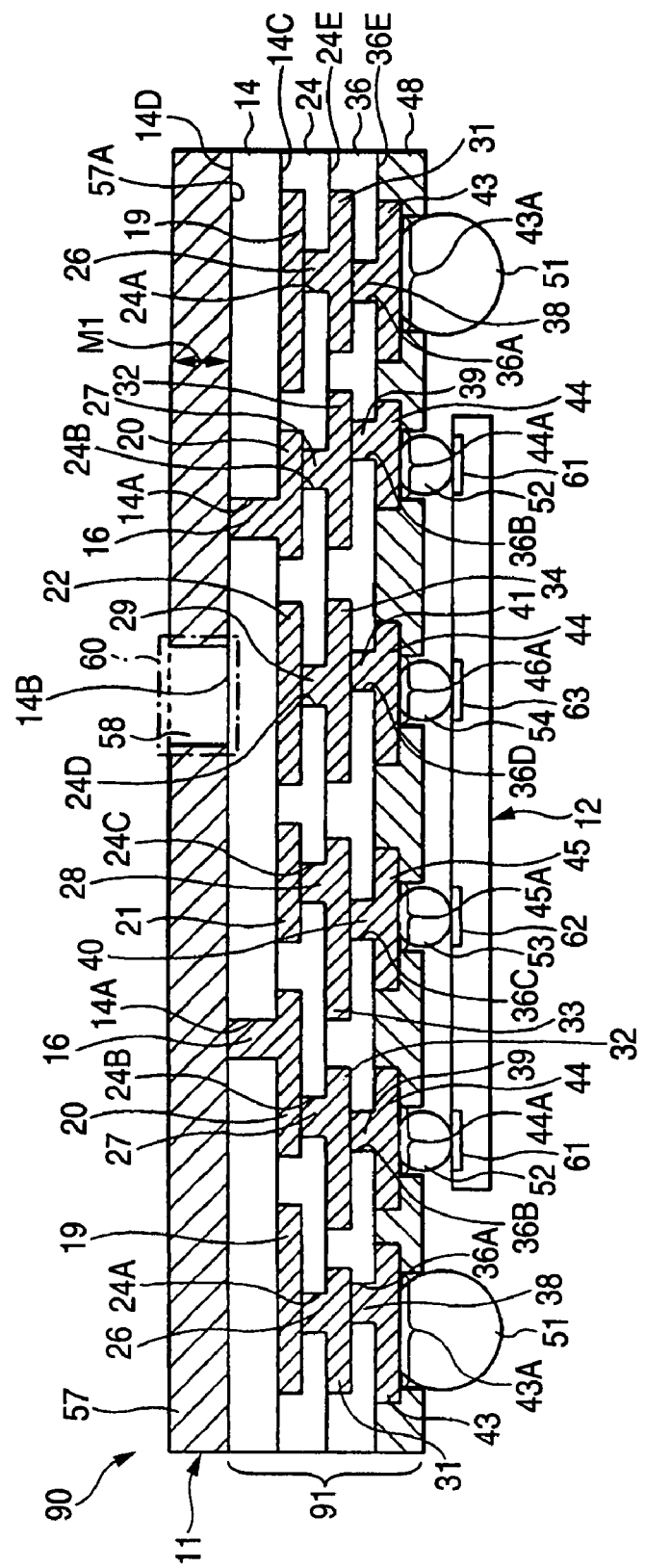
FIG. 21 is a sectional view of a semiconductor device according to a modified example of the first embodiment of the invention.
Figure 22:
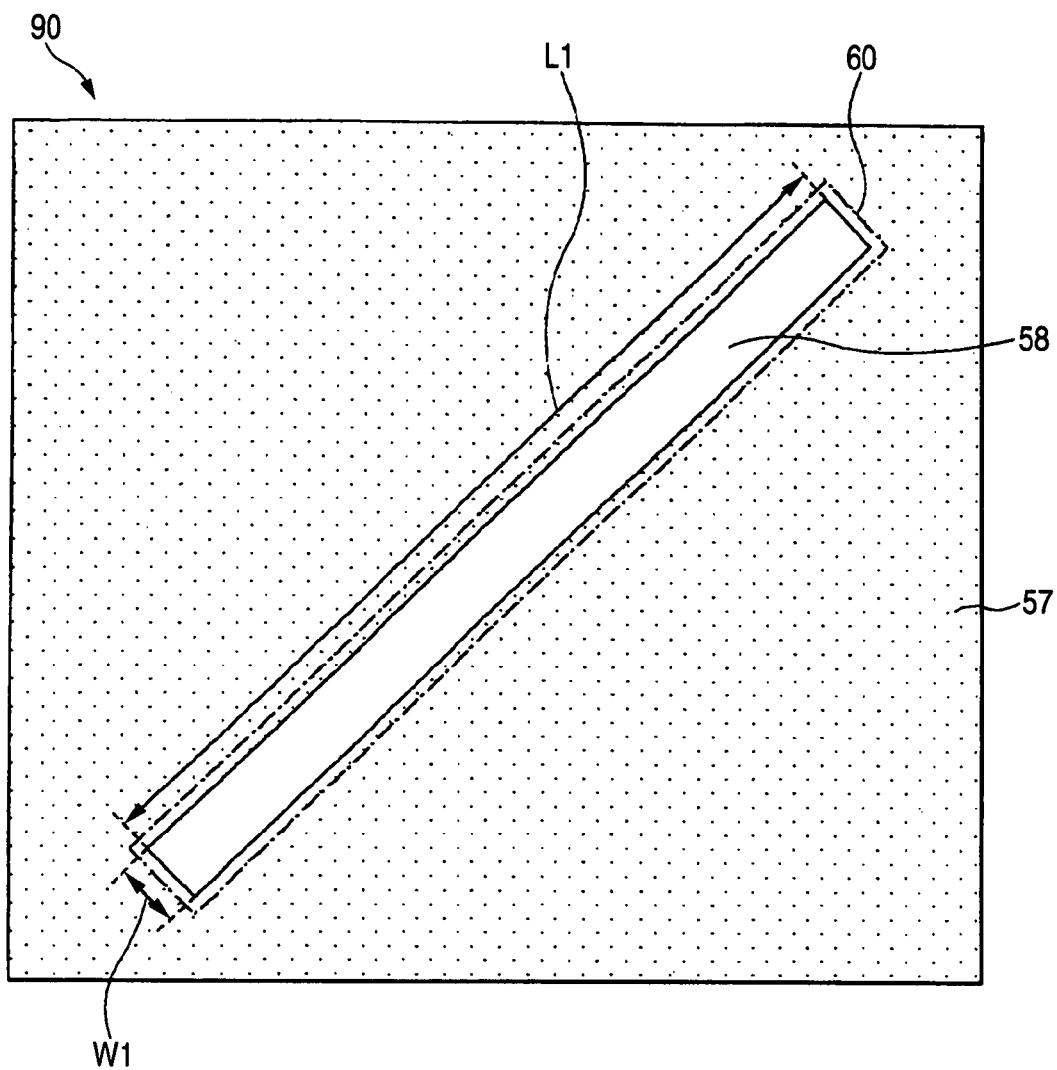
FIG. 22 is a diagram viewing the semiconductor device shown in FIG. 21 from the plane.

FIG. 21 is a sectional view of a semiconductor device according to a modified example of the first embodiment of the invention, and FIG. 22 is a diagram viewing the semiconductor device shown in FIG. 21 from the plane. In FIGS. 21 and 22, the same numerals are assigned to the same component portions as those of the semiconductor device 10 of the first embodiment.

Referring to FIGS. 21 and 22, a semiconductor device 90 according to the modified example of the first embodiment is constructed in a manner similar to the semiconductor device 10 except that a multilayer wiring structural body 91 is disposed instead of the multilayer wiring structural body 13 disposed in the semiconductor device 10 of the first embodiment. Also, the multilayer wiring structural body 91 is constructed in a manner similar to the multilayer wiring structural body 13 except that the first via 17 is removed from a configuration of the multilayer wiring structural body 13.

Also in the semiconductor device 90 constructed thus, an effect similar to that of the semiconductor device 10 of the first embodiment can be obtained.

Also, the semiconductor device 90 can be manufactured by a technique (concretely, the manufacturing method described in FIGS. 4 to 10 or the manufacturing method described in FIGS. 12 to 19) similar to that of the semiconductor device 10 of the first embodiment, and an effect similar to that of the manufacturing method of the semiconductor device 10 of the first embodiment can be obtained.

In addition, in the semiconductor device 10, 90, a microsplit line may be disposed in the multilayer wiring substrate 11 of the side on which the electronic component 12 is mounted.

Second Embodiment

Figure 23:
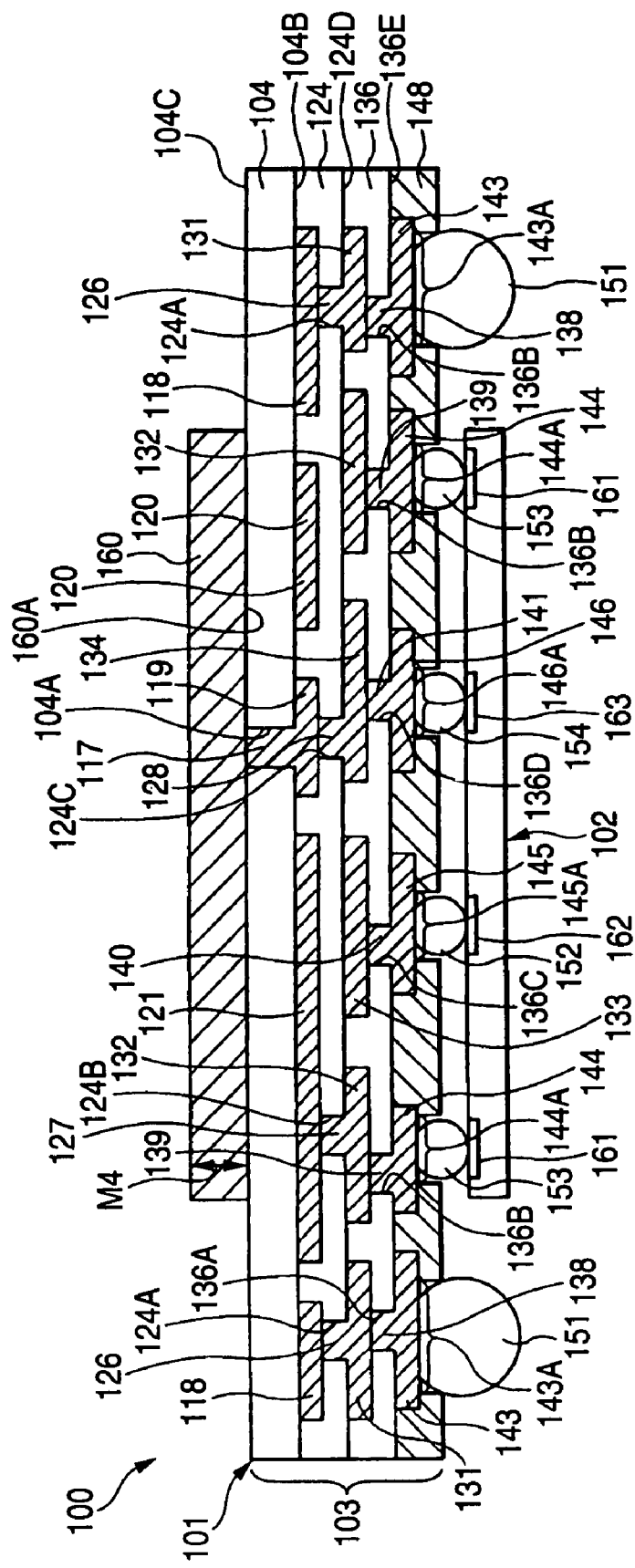
FIG. 23 is a sectional view of a semiconductor device according to a second embodiment of the invention.

FIG. 23 is a sectional view of a semiconductor device according to a second embodiment of the invention.

A semiconductor device 100 of the second embodiment will be described with reference to FIG. 23. In the present embodiment, a semiconductor device used in wireless communication equipment as the semiconductor device 100 will be described as an example.

The semiconductor device 100 has a wiring substrate 101 and an electronic component 102. The wiring substrate 101 is a coreless substrate, and has a multilayer wiring structural body 103, a first external connection terminal 151, second external connection terminals 152 to 154, and a patch antenna 160 which is an antenna.

The multilayer wiring structural body 103 has insulating layers 104, 124, 136, a first via 117, first wirings 118 to 120, a ground layer 121, second vias 126 to 128, second wirings 131 to 134, third vias 138 to 141, third wirings 143 to 146, and a protective film 148.

The insulating layer 104 is disposed so as to cover a surface 160A of the patch antenna 160. The insulating layer 104 has an opening 104A. The opening 104A is formed so as to expose a part of the surface 160A of the patch antenna 160. As the insulating layer 104, for example, a resin layer can be used. As a material of the resin layer, for example, an epoxy resin or a polyimide resin can be used.

The first via 117 is disposed in the opening 104A. The first via 117 is in contact with the patch antenna 160. The first via 117 is electrically connected to a pad 163 for signal of the electronic component 102. As a material of the first via 117, for example, a conductive metal can be used. Also, as the conductive metal, for example, Cu can be used.

The first wirings 118 to 120 are disposed on a surface 104B of the insulating layer 104. The first wiring 118 is electrically connected to the first external connection terminal 151. The first wiring 119 is constructed integrally with the first via 117. The first wiring 119 is electrically connected to the patch antenna 160 through the first via 117. As a material of the first wirings 118 to 120, for example, a conductive metal can be used. Also, as the conductive metal, for example, Cu can be used.

The ground layer 121 is disposed on the surface 104B of the insulating layer 104. The ground layer 121 is electrically connected to a pad 161 for ground of the electronic component 102, and is set at a ground potential.

The insulating layer 124 is disposed on the surface 104B of the insulating layer 104 so as to cover the first wirings 118 to 120 and the ground layer 121. The insulating layer 124 has an opening 124A for exposing a part of the first wiring 118, an opening 124B for exposing a part of the ground layer 121 and an opening 124C for exposing a part of the first wiring 119. As the insulating layer 124, for example, a resin layer can be used. As a material of the resin layer, for example, an epoxy resin or a polyimide resin can be used.

The second via 126 is disposed in the opening 124A and is in contact with the first wiring 118. The second via 127 is disposed in the opening 124B. The second via 127 is in contact with the ground layer 121. The second via 128 is disposed in the opening 124C. The second via 128 is in contact with the first wiring 119. As a material of the second vias 126 to 128, for example, a conductive metal can be used. Also, as the conductive metal, for example, Cu can be used.

The second wirings 131 to 134 are disposed on a surface 124D of the insulating layer 124. The second wiring 131 is constructed integrally with the second via 126. The second wiring 132 is constructed integrally with the second via 127. The second wiring 134 is constructed integrally with the second via 128. As a material of the second wirings 131 to 134, for example, a conductive metal can be used. Also, as the conductive metal, for example, Cu can be used.

The insulating layer 136 is disposed on the surface 124D of the insulating layer 124 so as to cover the second wirings 131 to 134. The insulating layer 136 has an opening 136A for exposing a part of the second wiring 131, an opening 136B for exposing a part of the second wiring 132, an opening 136C for exposing a part of the second wiring 133 and an opening 136D for exposing a part of the second wiring 134. As the insulating layer 136, for example, a resin layer can be used. As a material of the resin layer, for example, an epoxy resin or a polyimide resin can be used.

The third via 138 is disposed in the opening 136A. The third via 138 is in contact with the second wiring 131. The third via 139 is disposed in the opening 136B. The third via 139 is in contact with the second wiring 132. The third via 140 is disposed in the opening 136C. The third via 140 is in contact with the second wiring 133. The third via 141 is disposed in the opening 136D. The third via 141 is in contact with the second wiring 134. As a material of the third vias 138 to 141, for example, a conductive metal can be used. Also, as the conductive metal, for example, Cu can be used.

The third wirings 143 to 146 are disposed on a surface 136E of the insulating layer 136. The third wiring 143 is constructed integrally with the third via 138. The third wiring 143 has a connection part 143A to which the first external connection terminal 151 is connected. The third wiring 144 is constructed integrally with the third via 139. The third wiring 144 has a connection part 144A to which the second external connection terminal 153 is connected.

The third wiring 145 is constructed integrally with the third via 140. The third wiring 145 has a connection part 145A to which the second external connection terminal 152 is connected. The third wiring 146 is constructed integrally with the third via 141. The third wiring 146 has a connection part 146A to which the second external connection terminal 154 is connected. As a material of the third wirings 143 to 146, for example, a conductive metal can be used. Also, as the conductive metal, for example, Cu can be used.

The protective film 148 is disposed on the surface 136E of the insulating layer 136 so as to cover the third wirings 143 to 146. The protective film 148 is a film for protecting the third wirings 143 to 146, and has openings for exposing the connection parts 143A to 146A. As the protective film 148, for example, a solder resist can be used.

The first external connection terminal 151 is disposed in the connection part 143A. The first external connection terminal 151 is a terminal for electrically connecting the wiring substrate 101 to a mounting board (not shown) such as a motherboard. As the first external connection terminal 151, for example, a solder ball can be used.

The second external connection terminal 153 is disposed in the connection part 144A. The second external connection terminal 153 is connected to the pad 161 for ground of the electronic component 102. Consequently, the pad 161 for ground is electrically connected to the ground layer 121. The second external connection terminal 152 is disposed in the connection part 145A. The second external connection terminal 152 is connected to a pad 162 for power source of the electronic component 102.

The second external connection terminal 154 is disposed in the connection part 146A. The second external connection terminal 154 is connected to the pad 163 for signal of the electronic component 102. Consequently, the first via 117 is electrically connected to the pad 163 for signal of the electronic component 102.

Figure 24:
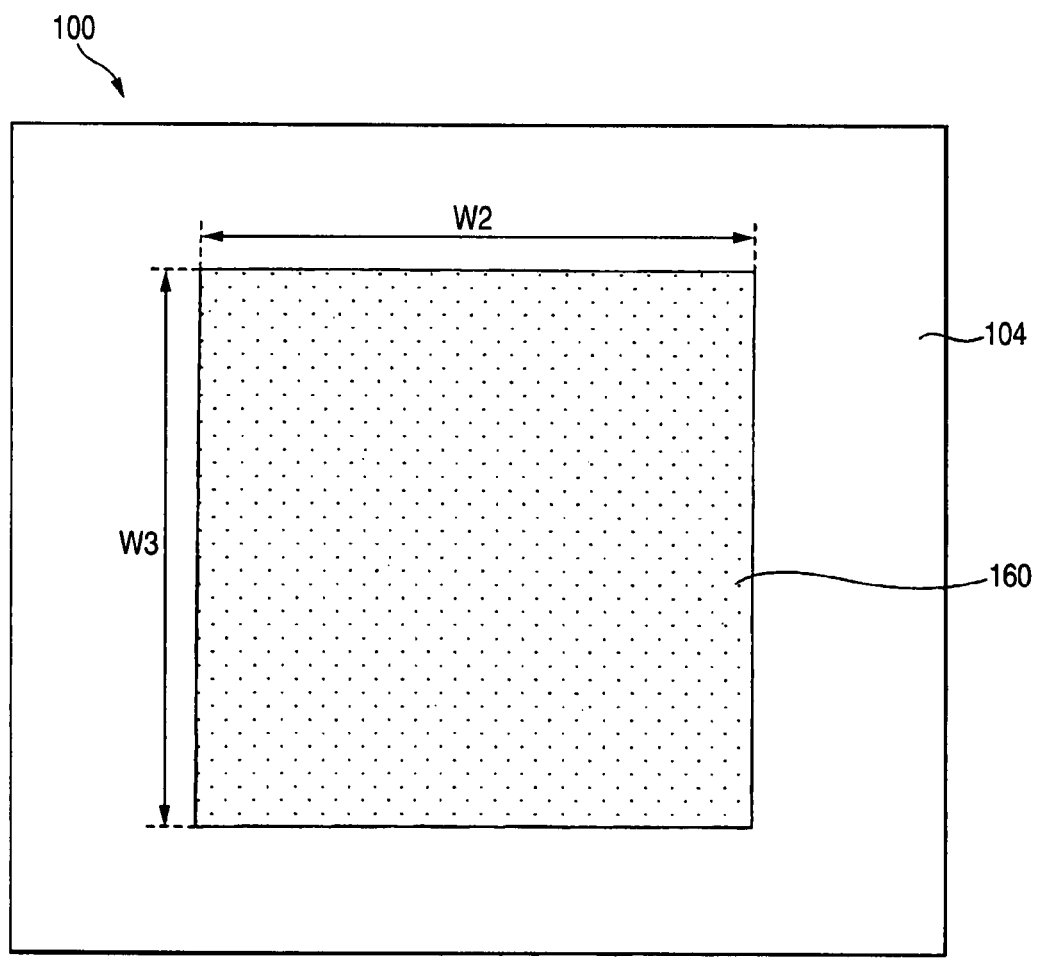
FIG. 24 is a diagram viewing the semiconductor device shown in FIG. 23 from the plane.

FIG. 24 is a diagram viewing the semiconductor device shown in FIG. 23 from the plane.

Referring to FIGS. 23 and 24, the patch antenna 160 is disposed on a surface 104C of the insulating layer 104. The patch antenna 160 is formed in a plate shape, and functions as an antenna at the time of supplying a current flowing into the first via 117 electrically connected to the pad 163 for signal. When the semiconductor device 100 is a semiconductor device used in a band of a frequency of 60 GHz, widths W2, W3 of the patch antenna 160 can be set at, for example, 1.4 mm. In this case, a thickness M4 of the patch antenna 160 can be set at, for example, 20 to 30 µm.

Referring to FIG. 23, the electronic component 102 has the pad 161 for ground connected to the second external connection terminal 153, the pad 162 for power source connected to the second external connection terminal 152 and the pad 163 for signal connected to the second external connection terminal 154. Flip chip connection between the electronic component 102 and the wiring substrate 101 is made through the second external connection terminals 152 to 154. As the electronic component 102, for example, a semiconductor chip equipped with a configuration of an RFIC (concretely, a circuit for generating a signal) and a configuration of a control circuit for controlling a signal from the RFIC can be used.

According to the semiconductor device of the embodiment, by disposing the patch antenna 160 on the side opposite to the side to which the electronic component 102 of the multilayer wiring structural body 103 is connected, a size in a surface direction of the wiring substrate 101 can be miniaturized as compared with a wiring substrate in which the electronic component 102 and the patch antenna 160 are disposed on the same plane of the multilayer wiring structural body 103, so that the semiconductor device 100 can be miniaturized.

Also, since a length of a power feeding line (power feeding line constructed by the first to third vias 117, 128, 141 and the first to third wirings 119, 134, 146) for supplying a current for signal to the patch antenna 160 is decreased (only substantially the thickness of the multilayer wiring structural body 103 is required), transmission loss in the power feeding line can be reduced.

In addition, in the embodiment, the case where the number of laminations of the multilayer wiring structural body 103 disposed in the wiring substrate 101 (the number of laminations of wirings and insulating layers) is three layers has been described as an example, but the number of laminations of the multilayer wiring structural body 103 may be two layers or may be three layers or more.

Figure 25:
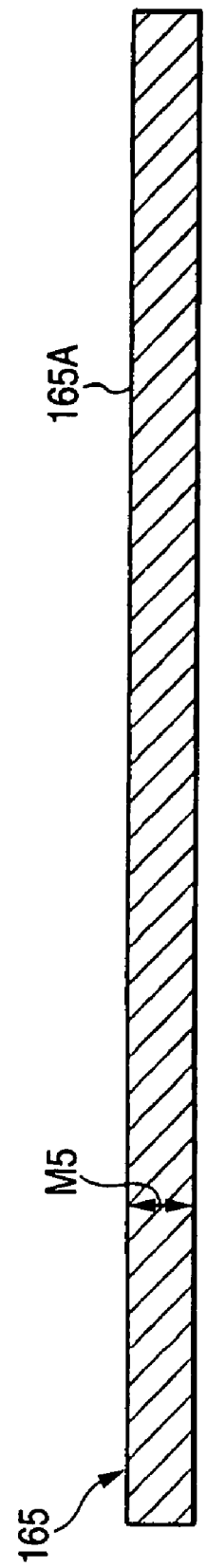
FIG. 25 is a diagram showing a manufacturing step of the semiconductor device according to the second embodiment of the invention (first).
Figure 26:
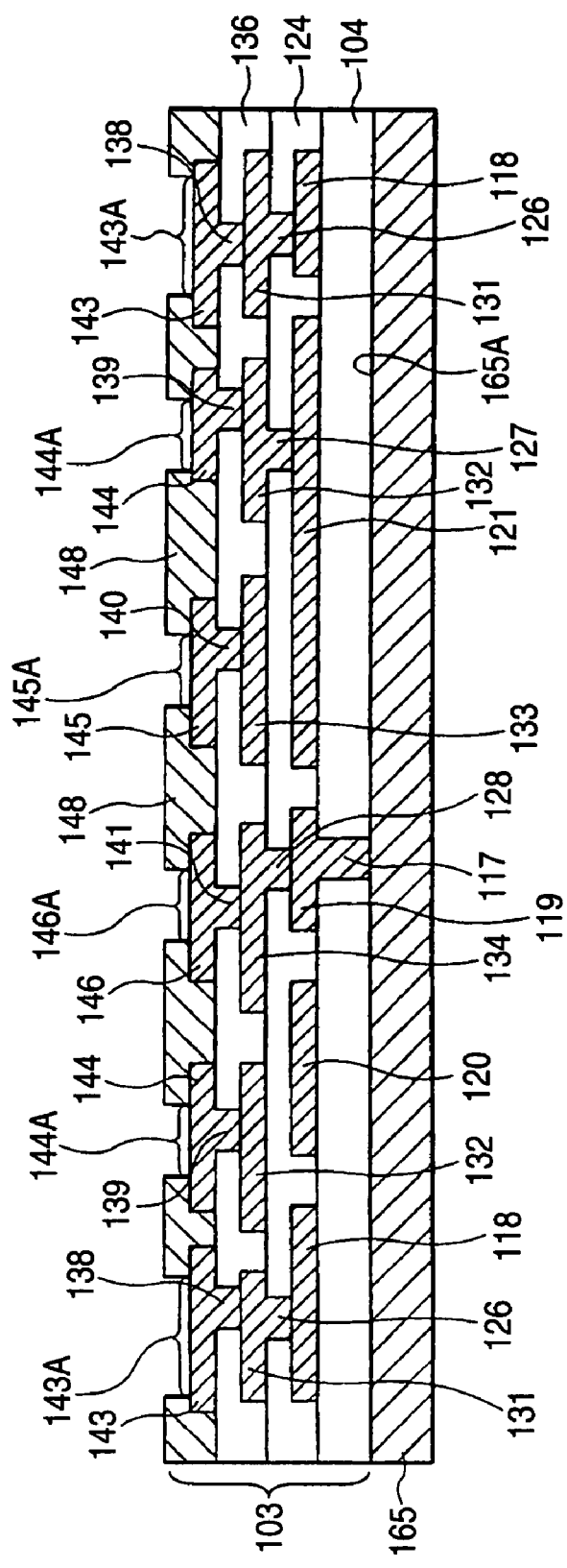
FIG. 26 is a diagram showing a manufacturing step of the semiconductor device according to the second embodiment of the invention (second).
Figure 27:
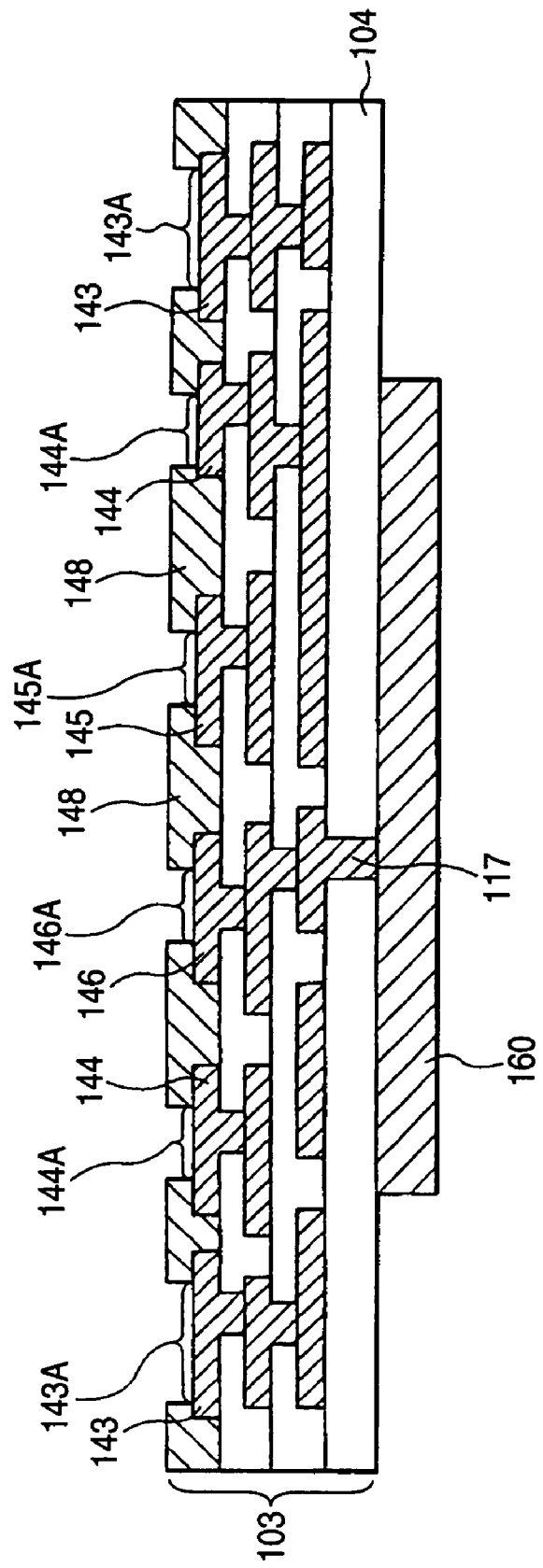
FIG. 27 is a diagram showing a manufacturing step of the semiconductor device according to the second embodiment of the invention (third).
Figure 28:
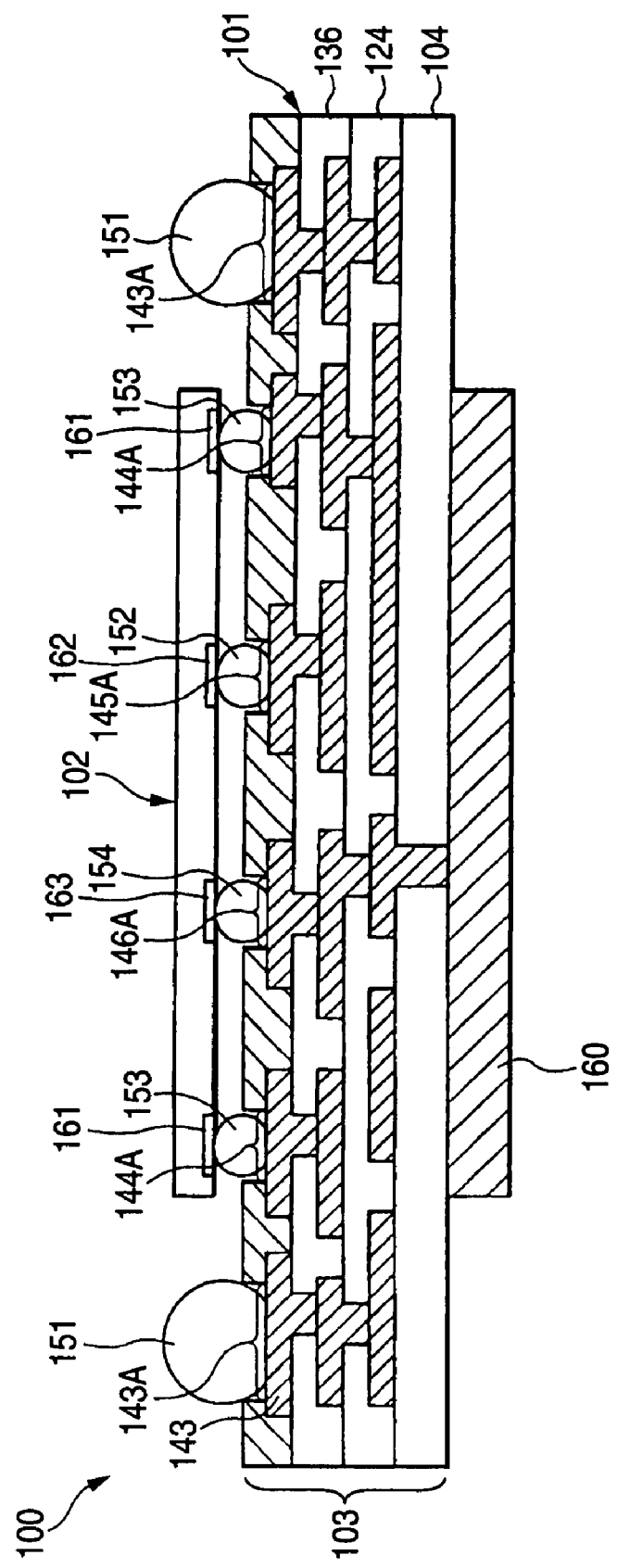
FIG. 28 is a diagram showing a manufacturing step of the semiconductor device according to the second embodiment of the invention (fourth).
Figure 29:
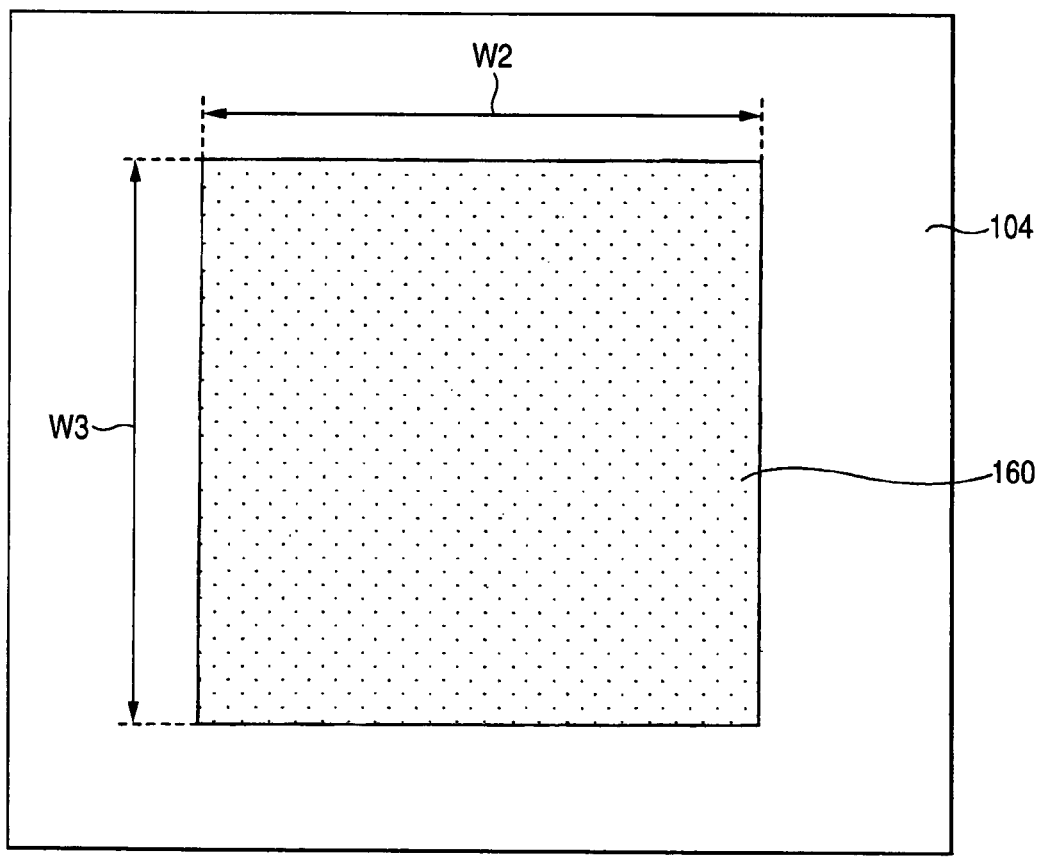
FIG. 29 is a diagram viewing a structural body shown in FIG. 27 from the plane.

FIGS. 25 to 28 are diagrams showing manufacturing steps of the semiconductor device according to the second embodiment of the invention, and FIG. 29 is a diagram viewing a structural body shown in FIG. 27 from the plane. In FIGS. 25 to 29, the same numerals are assigned to the same component portions as those of the semiconductor device 100 of the second embodiment.

A manufacturing method of the semiconductor device 100 according to the second embodiment of the invention will be described with reference to FIGS. 25 to 29.

First, in a step shown in FIG. 25, a metal plate 165 used as a support plate in the case of forming a multilayer wiring structural body 103 is prepared. As the metal plate 165, for example, metal foil can be used. As the metal foil, for example, Cu foil can be used. A thickness M5 of the metal plate 165 can be set at, for example, 20 to 30 µm.

Next, in a step shown in FIG. 26, the multilayer wiring structural body 103 is formed on a surface 165A of the metal plate 165 by a technique similar to the steps shown in FIGS. 5 to 7 described in the first embodiment (a multilayer wiring structural body formation step).

Then, in a step shown in FIG. 27, the metal plate 165 is patterned and a patch antenna 160 is formed (an antenna formation step) Concretely, for example, the patch antenna 160 is formed by an isotropic etching of the metal plate 165. As the anisotropic etching, wet etching or dry etching can be used.

By patterning the metal plate 165 used as the support plate in the case of forming the multilayer wiring structural body 103 and forming the patch antenna 160 thus, the need for a step of removing the metal plate 165 is eliminated, so that the number of manufacturing steps of a wiring substrate 101 can be reduced, so that a manufacturing cost of the wiring substrate 101 can be reduced.

When the semiconductor device 100 is a semiconductor device used in a band of a frequency of 60 GHz, widths W2, W3 of the patch antenna 160 can be set at, for example, 1.4 mm (see FIG. 29).

Then, in a step shown in FIG. 28, a first external connection terminal 151 and second external connection terminals 152 to 154 are formed on connection parts 143A to 146A of a structural body shown in FIG. 27 by a technique similar to the step shown in FIG. 9 described above. Consequently, the wiring substrate 101 is formed. Then, a pad 161 for ground, a pad 162 for power source and a pad 163 for signal of an electronic component 102 are connected to the second external connection terminals 152 to 154 of the wiring substrate 101 (flip chip connection). Consequently, the semiconductor device 100 comprising the wiring substrate 101 and the electronic component 102 is manufactured. As the first external connection terminal 151, for example, a solder ball can be used. Also, as the second external connection terminals 152 to 154, for example, a solder bump can be used.

According to the manufacturing method of the semiconductor device of the embodiment, by patterning the metal plate 165 used as the support plate in the case of forming the multilayer wiring structural body 103 and forming the patch antenna 160, the need for a step of removing the metal plate 165 is eliminated, so that the number of manufacturing steps of the wiring substrate 101 can be reduced, so that a manufacturing cost of the semiconductor device 100 can be reduced.

Also, in the manufacturing method of the semiconductor device of the embodiment, the case of forming one multilayer wiring structural body 103 in one metal plate 165 has been described as an example, but plural semiconductor device 100 may be manufactured by forming plural multilayer wiring structural bodies 103 in one metal plate 165 and then mounting the electronic component 102 in each of the multilayer wiring structural bodies 103 and thereafter dividing the multilayer wiring structural bodies 103 into individual pieces.

Figure 30:
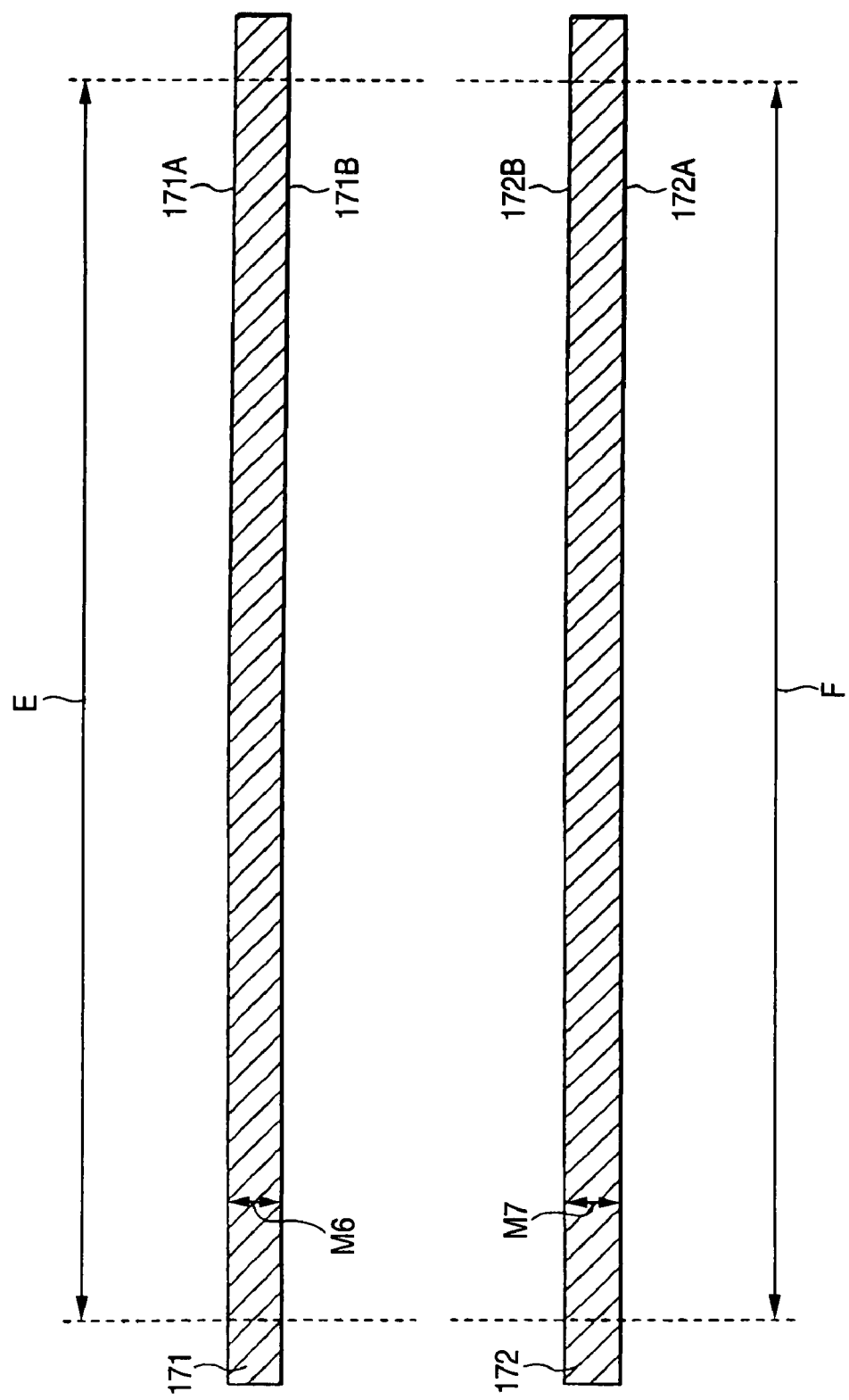
FIG. 30 is a diagram showing another example of a manufacturing step of the semiconductor device according to the second embodiment of the invention (first).
Figure 31:
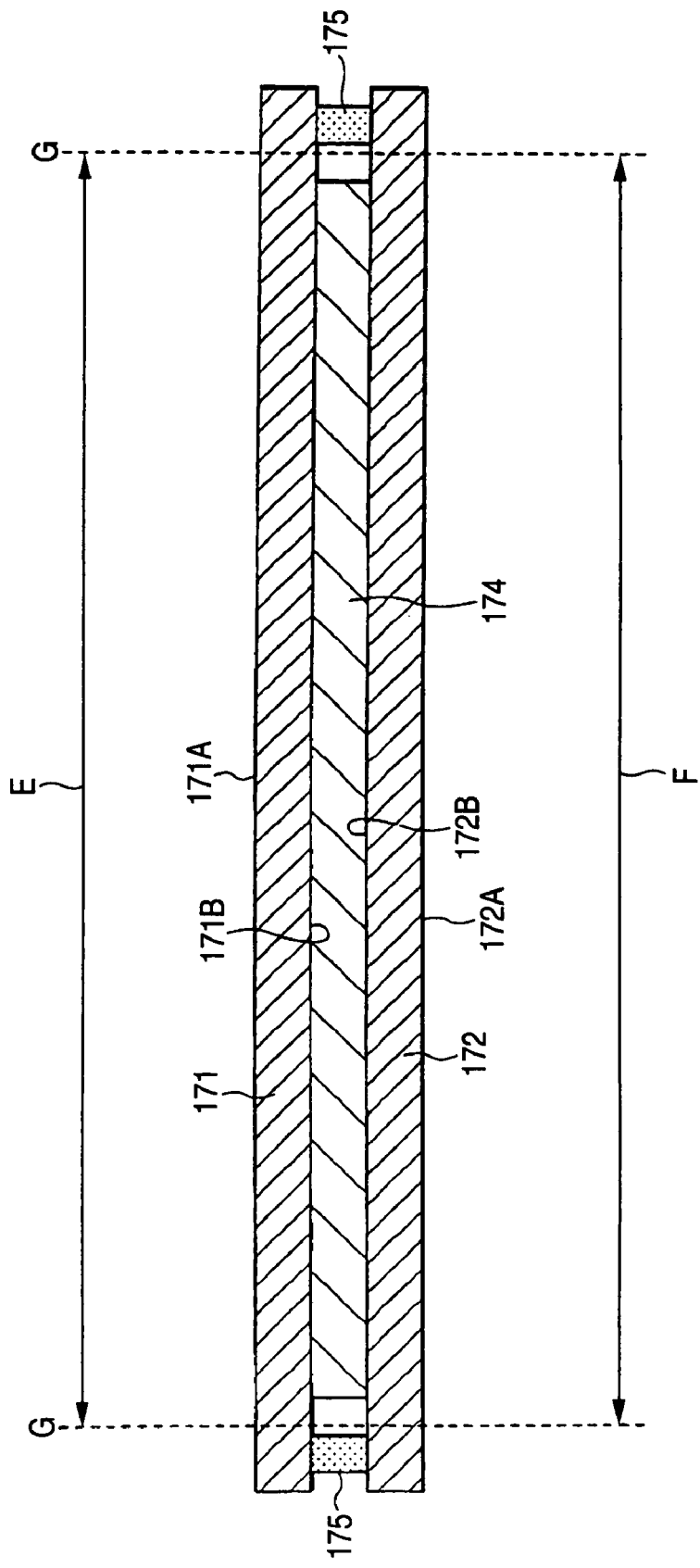
FIG. 31 is a diagram showing another example of a manufacturing step of the semiconductor device according to the second embodiment of the invention (second).
Figure 32:
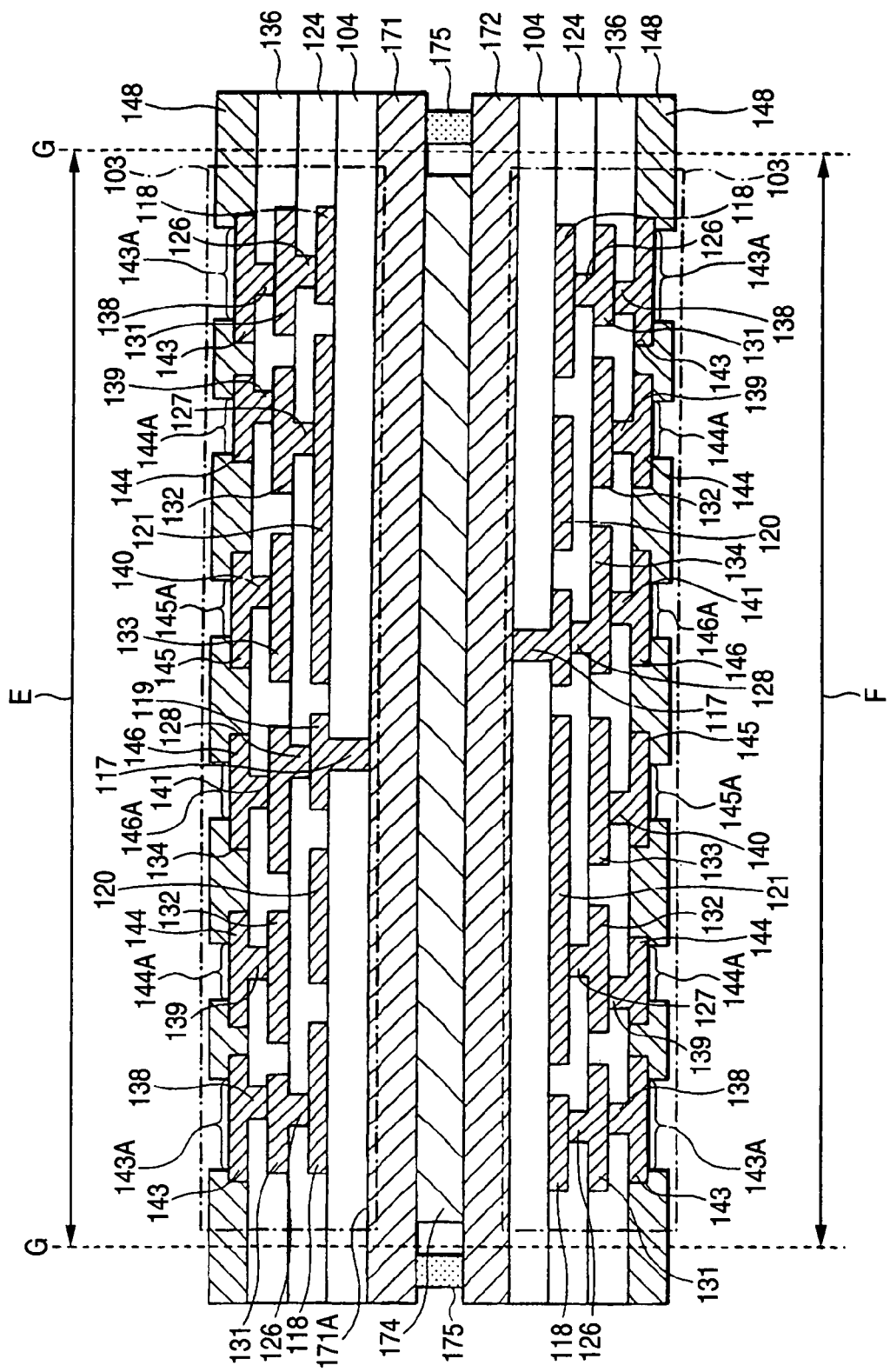
FIG. 32 is a diagram showing another example of a manufacturing step of the semiconductor device according to the second embodiment of the invention (third).
Figure 33:
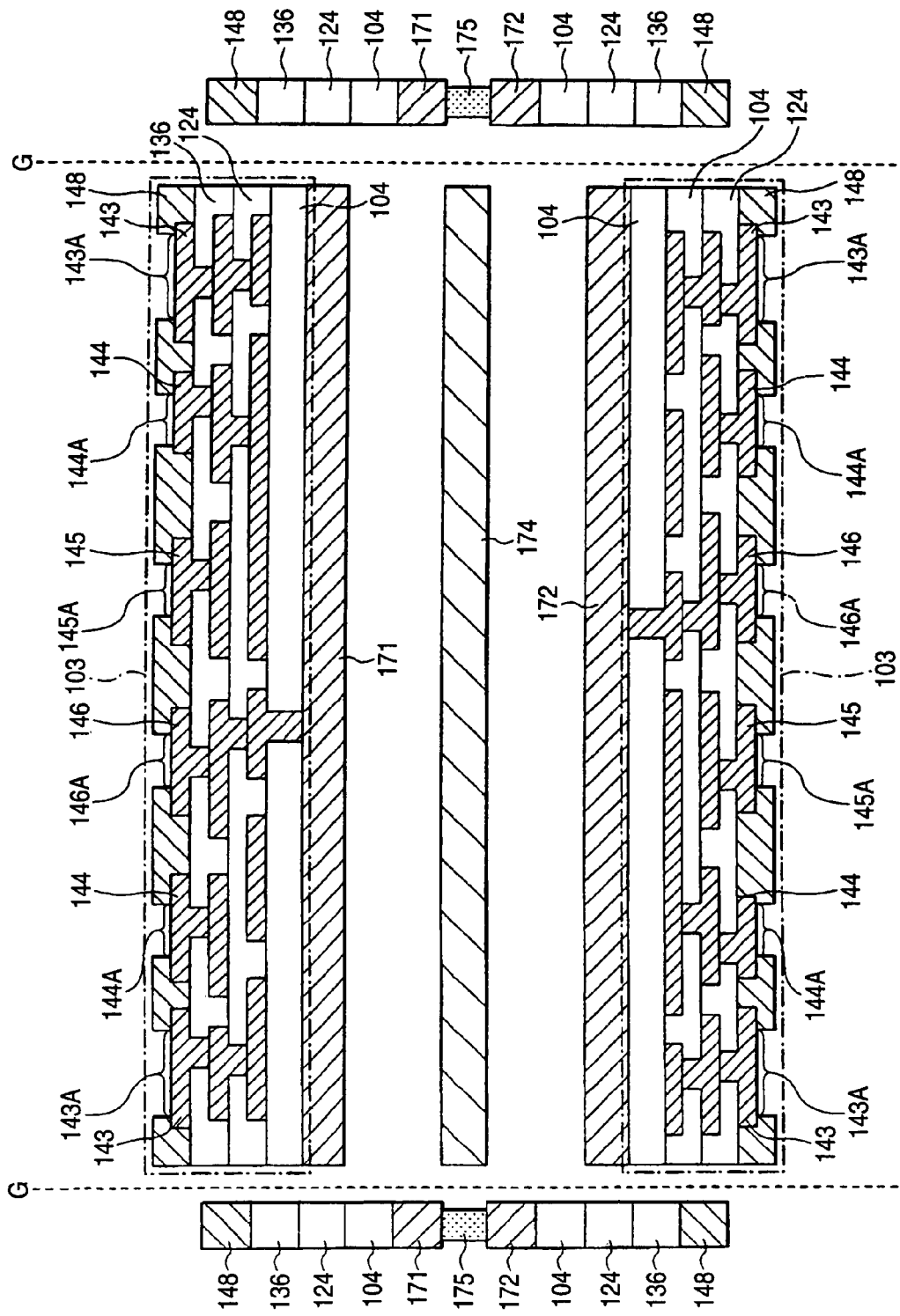
FIG. 33 is a diagram showing another example of a manufacturing step of the semiconductor device according to the second embodiment of the invention (fourth).
Figure 34:
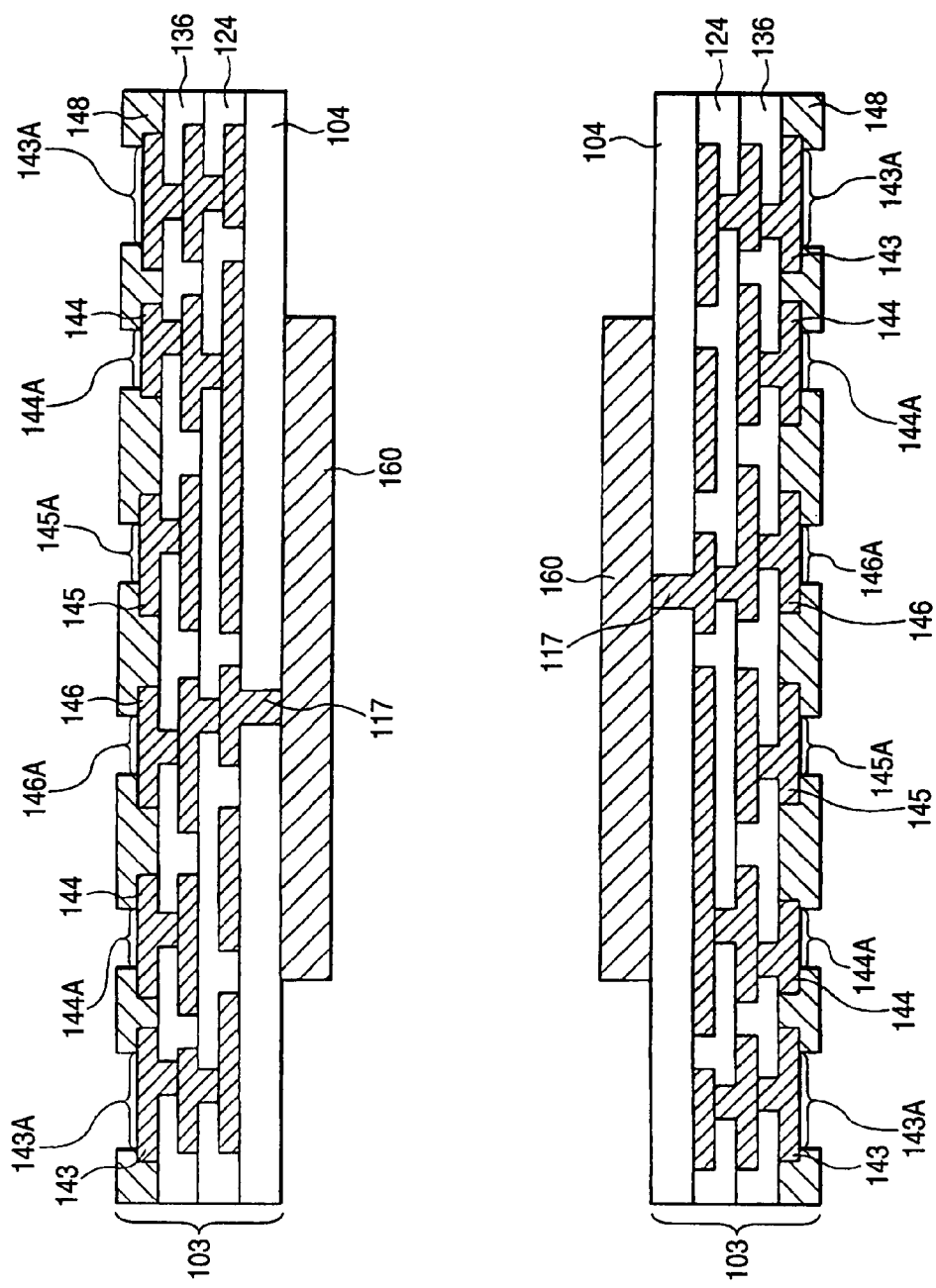
FIG. 34 is a diagram showing another example of a manufacturing step of the semiconductor device according to the second embodiment of the invention (fifth).
Figure 36:
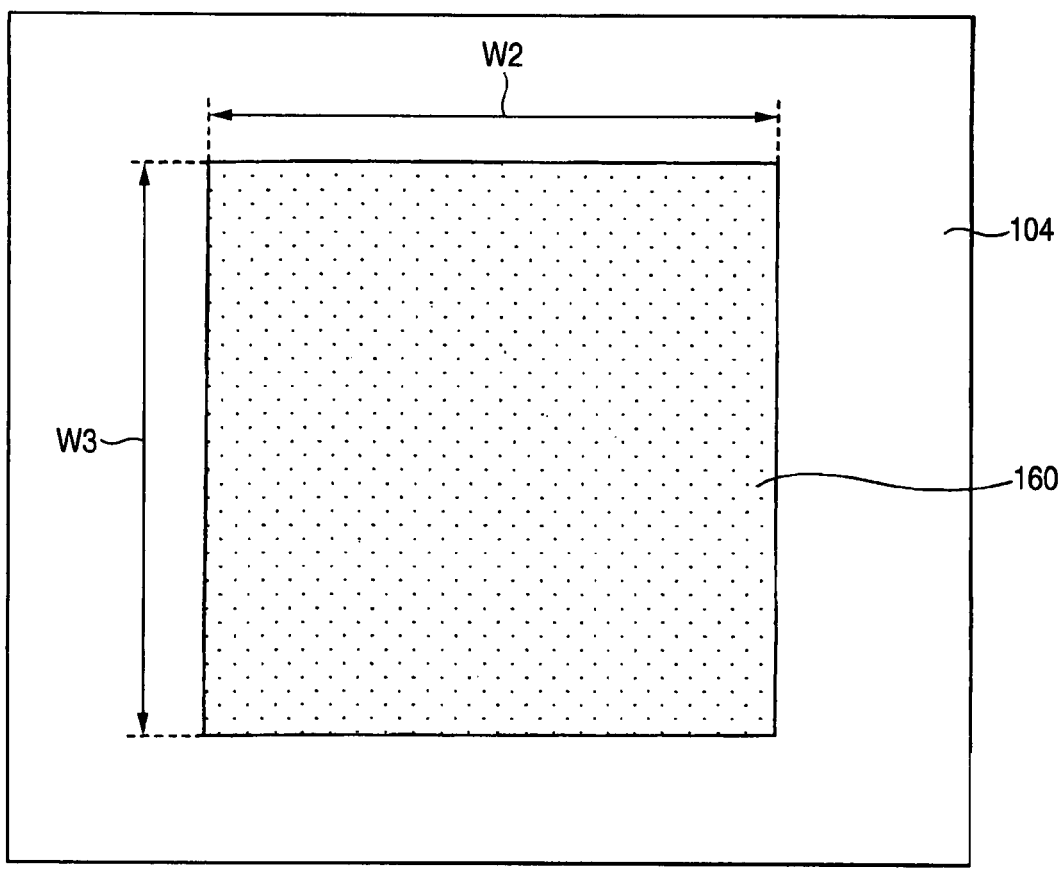
FIG. 36 is a diagram viewing a first metal plate in which a multilayer wiring structural body shown in FIG. 34 is formed from the plane.

FIGS. 30 to 35 are diagrams showing another example of manufacturing steps of a semiconductor device according to the second embodiment of the invention. FIG. 36 is a diagram viewing a first metal plate in which a multilayer wiring structural body shown in FIG. 34 is formed from the plane. In FIGS. 30 to 36, the same numerals are assigned to the same component portions as those of the semiconductor device 100 of the second embodiment. Also, G shown in FIGS. 31 to 33 shows a position (hereinafter called "a cut position G") in first and second metal plates 171, 172 are cut.

Another example of a manufacturing method of the semiconductor device 100 of the second embodiment of the invention will be described with reference to FIGS. 30 to 36. The case of forming semiconductor device 100-1, 100-2 in the first and second metal plates 171, 172 will be described herein as an example. The semiconductor device 100-1, 100-2 are constructed in a manner similar to the semiconductor device 100 except that the first metal plate 171 or the second metal plate 172 is disposed instead of the metal plate 165 disposed in the semiconductor device 100. Also, in the following description, a wiring substrate disposed in the semiconductor device 100-1 is set at a wiring substrate 101-1 and a wiring substrate disposed in the semiconductor device 100-2 is set at a wiring substrate 101-2.

First, in a step shown in FIG. 30, the first metal plate 171 having a multilayer wiring structural body formation region E in which a multilayer wiring structural body 103 is formed and the second metal plate 172 having a multilayer wiring structural body formation region F in which a multilayer wiring structural body 103 is formed are prepared (a metal plate preparation step).

The first and second metal plates 171, 172 are used as support plates in the case of forming the multilayer wiring structural body 103 and also members for forming patch antennas 160. As the first and second metal plates 171, 172, for example, metal foil can be used. As the metal foil, for example, Cu foil can be used. Thicknesses M6, M7 of the first and second metal plates 171, 172 could be made substantially equal to the thickness M5 of the patch antenna 160. The thicknesses M6, M7 of the first and second metal plates 171, 172 can be set at, for example, 20 to 30 μm.

Next, in a step shown in FIG. 31, the first metal plate 171 is pasted to the second metal plate 172 by an adhesive 175 so as to oppose a second surface 171B (a surface on which the multilayer wiring structural body 103 is not formed) of the first metal plate 171 to a second surface 172B (a surface on which the multilayer wiring structural body 103 is not formed) of the second metal plate 172 through a reinforcing plate 174 such as a resin plate (a metal plate pasting step).

The adhesive 175 is disposed in the outside of the multilayer wiring structural body formation regions E, F. The reinforcing plate 174 is a plate for preventing the first and second metal plates 171, 172 from bending in the case of forming the multilayer wiring structural body 103.

Then, in a step shown in FIG. 32, the multilayer wiring structural bodies 103 are formed in the multilayer wiring structural body formation regions E, F of the first and second metal plates 171, 172 by a technique similar to the steps shown in FIGS. 5 to 7 described in the first embodiment (a multilayer wiring structural body formation step).

Then, in a step shown in FIG. 33, the first and second metal plates 171, 172 in which the multilayer wiring structural bodies 103 are formed are cut along the cut positions G (a metal plate cut step). Consequently, the first metal plate 171 in which the multilayer wiring structural body 103 is formed and the second metal plate 172 in which the multilayer wiring structural body 103 is formed are divided into individual pieces.

By pasting the first metal plate 171 to the second metal plate 172 and simultaneously forming the multilayer wiring structural bodies 103 on first surfaces 171A, 172A of the first and second metal plates 171, 172 thus, the number of manufacturing steps of the wiring substrates 101-1, 101-2 becomes smaller than the case of separately forming the multilayer wiring structural bodies 103 on two metal plates, so that a manufacturing cost of the wiring substrates 101-1, 101-2 can be reduced.

Then, in a step shown in FIG. 34, the first and second metal plates 171, 172 are respectively patterned and the patch antennas 160 are formed (an antenna formation step). Concretely, the first and second metal plates 171, 172 are patterned by anisotropic etching and the patch antennas 160 are formed. As the anisotropic etching, wet etching or dry etching can be used.

By patterning the first and second metal plates 171, 172 used as support plates in the case of forming the multilayer wiring structural bodies 103 and forming the patch antennas 160 thus, the need for a step of removing the first and second metal plates 171, 172 is eliminated, so that a manufacturing cost of the wiring substrates 101-1, 101-2 can be reduced.

When the semiconductor device 100-1, 100-2 are a semiconductor device used in a band of a frequency of 60 GHz, widths W2, W3 of the patch antenna 160 can be set at, for example, 1.4 mm (see FIG. 36).

Then, in a step shown in FIG. 35, a first external connection terminal 151 and second external connection terminals 152 to 154 are formed on connection parts 143A to 146A of a structural body shown in FIG. 34 by a technique similar to the steps shown in FIGS. 9 and 10 described in the first embodiment. Consequently, the wiring substrates 101-1, 101-2 are formed.

Thereafter, a pad 161 for ground, a pad 162 for power source and a pad 163 for signal of an electronic component 102 are connected to the second external connection terminals 152 to 154 of the wiring substrates 101-1, 101-2 (flip chip connection). Consequently, the semiconductor device 100-1 comprising the wiring substrate 101-1 and the electronic component 102 and the semiconductor device 100-2 comprising the wiring substrate 101-2 and the electronic component 102 are manufactured.

As the first external connection terminal 151, for example, a solder ball can be used. Also, as the second external connection terminals 152 to 154, for example, a solder bump can be used.

According to another manufacturing method of the semiconductor device of the embodiment, by pasting the first metal plate 171 to the second metal plate 172 and simultaneously forming the multilayer wiring structural bodies 103 on the first surfaces 171A, 172A of the first and second metal plates 171, 172, the number of manufacturing steps of the wiring substrates 101-1, 101-2 becomes smaller than the case of separately forming the multilayer wiring structural bodies 103 on two metal plates, so that a manufacturing cost of the semiconductor device 100-1, 100-2 can be reduced.

Also, by patterning the first and second metal plates 171, 172 used as support plates in the case of forming the multilayer wiring structural bodies 103 and forming the patch antennas 160, the need for a step of removing the first and second metal plates 171, 172 is eliminated, so that the number of manufacturing steps of the wiring substrates 101-1, 101-2 can be reduced, so that a manufacturing cost of the semiconductor device 100-1, 100-2 can be reduced.

Further, in another manufacturing method of the semiconductor device of the embodiment, the case of respectively forming one multilayer wiring structural body 103 in the first and second metal plates 171, 172 has been described as an example, but plural semiconductor device 100-1, 100-2 may be manufactured by respectively forming plural multilayer wiring structural bodies 103 in the first and second metal plates 171, 172 and cutting the first and second metal plates 171, 172 and thereafter mounting the electronic components 102 in each of the multilayer wiring structural bodies 103.

Also, in another manufacturing method of the semiconductor device of the embodiment, the case of sticking the first metal plate 171 to the second metal plate 172 through the reinforcing plate 174 has been described as an example, but the semiconductor device 100-1, 100-2 may be manufactured by directly pasting the first metal plate 171 to the second metal plate 172.

Third Embodiment

Figure 37:
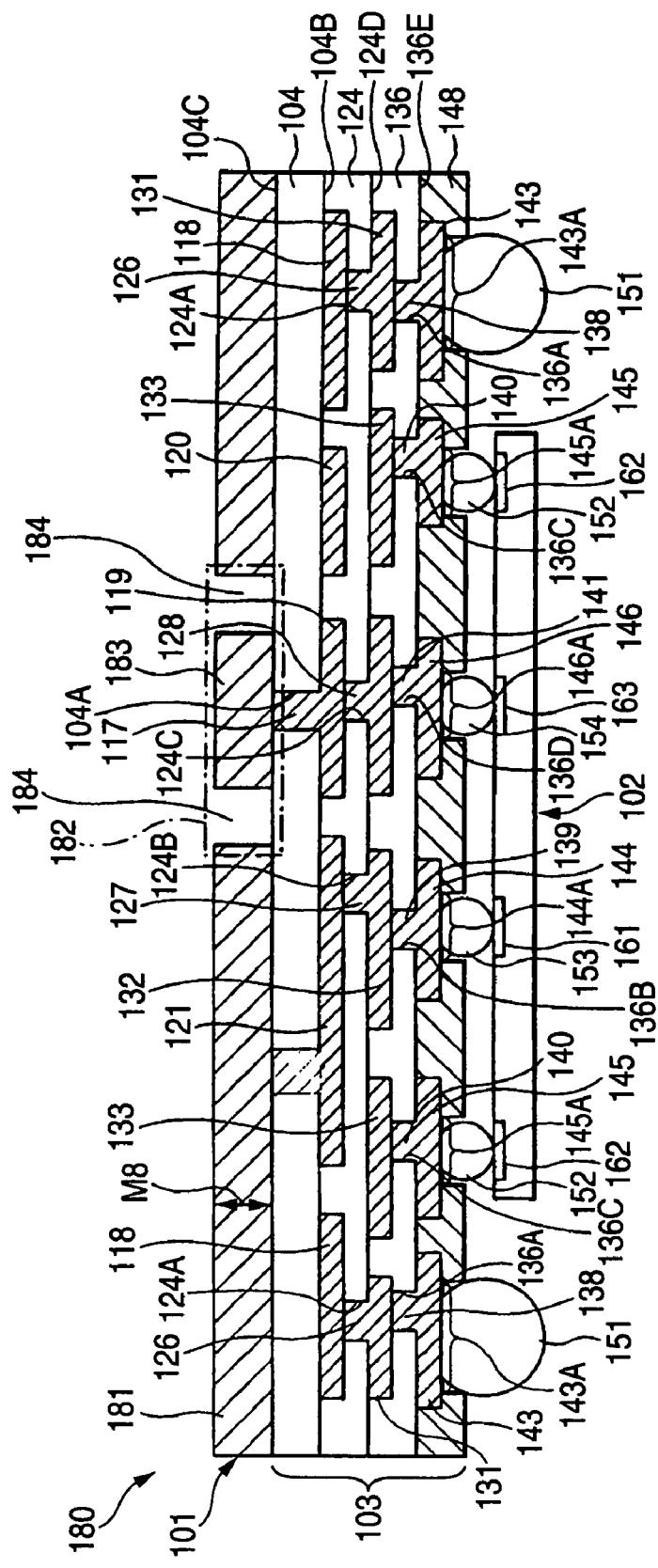
FIG. 37 is a sectional view of a semiconductor device according to a third embodiment of the invention.

FIG. 37 is a sectional view of a semiconductor device according to a third embodiment of the invention. In FIG. 37, the same numerals are assigned to the same component portions as those of the semiconductor device 100 of the second embodiment.

Referring to FIG. 37, a semiconductor device 180 of the third embodiment is constructed in a manner similar to the semiconductor device 100 except that a metal plate 181 and a circular patch antenna 182 are disposed instead of the patch antenna 160 disposed in the semiconductor device 100 of the second embodiment.

The metal plate 181 is disposed so as to cover a surface 104C of an insulating layer 104. As the metal plate 181, for example, metal foil can be used. As the metal foil, for example, Cu foil can be used. A thickness M8 of the metal plate 181 (thickness of the circular patch antenna 182) can be set at, for example, 20 to 30 μm.

Figure 38:
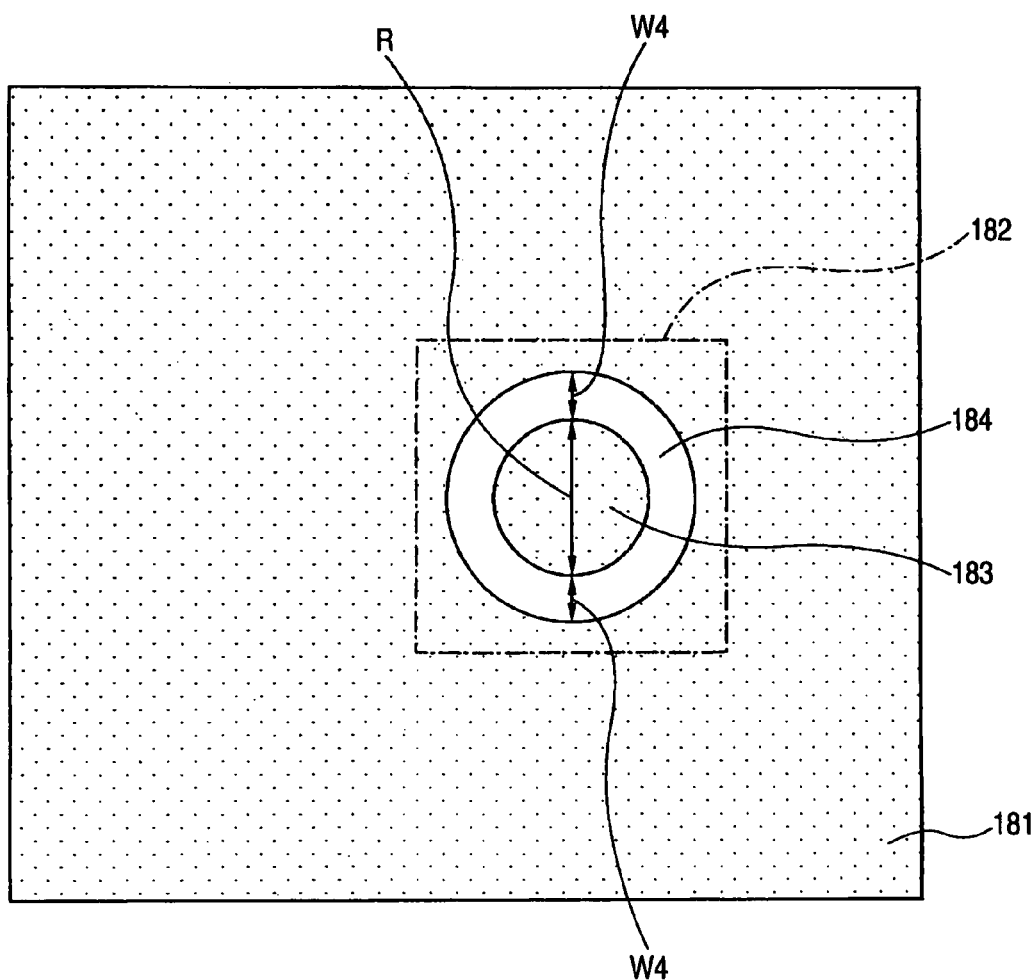
FIG. 38 is a diagram viewing the semiconductor device shown in FIG. 37 from the plane.

FIG. 38 is a diagram viewing the semiconductor device shown in FIG. 37 from the plane.

Referring to FIGS. 37 and 38, the circular patch antenna 182 is configured to have a circular part 183 and a groove part 184 formed so as to surround the periphery of the circular part 183. The circular part 183 is electrically connected to a pad 163 for signal of an electronic component 102. When the semiconductor device 180 is a semiconductor device used in a band of a frequency of 60 GHz, a diameter R of the circular part 183 can be set at, for example, 1.1 mm. Also, in this case, a width W4 of the groove part 184 can be set at, for example, 0.3 mm.

Also in the semiconductor device 180 of the third embodiment constructed thus, an effect similar to that of the semiconductor device 100 of the second embodiment can be obtained.

Also, the semiconductor device 180 of the third embodiment can be manufactured by a technique similar to the semiconductor device 100 of the second embodiment, and an effect similar to that of the manufacturing method of the semiconductor device 100 of the second embodiment can be obtained.

The preferred embodiments of the invention have been described above in detail, but the invention is not limited to such specific embodiments, and various modifications and changes can be made within the gist of the invention described in the claims.

In addition, in the first to third embodiments, the case of forming the slot antenna or the patch antenna (including the circular patch antenna) in the metal plate as an antenna has been described as an example, but antennas other than the slot antenna and the patch antenna (including the circular patch antenna) may be formed in the metal plate.

According to the invention, it can be applied to a wiring substrate comprising a multilayer wiring structural body, an antenna and an electronic component disposed in the multilayer wiring structural body, and a semiconductor device comprising the wiring substrate.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of manufacturing a plurality of semiconductor devices, each semiconductor device including a multilayer wiring structural body having a laminated wiring pattern and an insulating layer, an antenna disposed on one surface of said multilayer wiring structural body, and an electronic component disposed on another surface of said multilayer wiring structural body opposite to the one surface of the multilayer wiring structural body, the electronic component being electrically connected to the multilayer wiring structural body, the manufacturing method comprising:

provviding a first metal plate and a second metal plate;

pasting the first metal plate to the second metal plate such that a surface opposite to a surface of the first metal plate on which the multilayer wiring structural body is to be formed is opposed to a surface opposite to a surface of the second metal plate on which the multilayer wiring structural body is to be formed;

simultaneously forming the multilayer wiring structural bodies on the first and second metal plates such that the first and second metal plates support the respective multilayer wiring structural bodies while forming the respective multilayer wiring structural bodies; and patterning the first and second metal plates to form the antennas in the first and second metal plates.

2. The method of manufacturing a plurality of semiconductor devices as claimed in claim 1, wherein forming the antennas is performed before pasting the first metal plate to the second metal plate.

3. The method of manufacturing a plurality of semiconductor devices as claimed in claim 1, further comprising:

separating the first metal plate on which the multilayer wiring structural body is formed from the second metal plate on which the multilayer wiring structural body is formed by cutting end portions of the first and second metal plates after forming the multilayer wiring structural bodies.

4. A method of manufacturing a semiconductor device, the semiconductor device including a multilayer wiring structural body having a laminated wiring pattern and an insulating layer, an antenna disposed on one surface of said multilayer wiring structural body, and an electronic component disposed on another surface of said multilayer wiring structural body opposite to the one surface of the multilayer wiring structural body, the electronic component being electrically connected to the multilayer wiring structural body, the manufacturing method comprising:

providing a metal plate;

forming the multilayer wiring structural body on the metal plate such that the metal plate supports the multilayer wiring structural body while forming the multilayer wiring structural body, wherein the multilayer wiring structural body is formed with at least a first layer formed on the metal plate and then a second layer formed on the first layer and the metal plate;

patterning the metal plate to form the antenna in the metal plate;

forming a connection, part for the electronic component on the another surface of said multilayer wiring structural body; and mounting the electronic component on the connection part.

5. The method of manufacturing a semiconductor device as claimed in claim 4, wherein forming the antenna is performed before forming the multilayer wiring structural body.

6. A method of manufacturing a semiconductor device, the semiconductor device including a multilayer wiring structural body having a laminated wiring pattern and an insulating layer, an antenna disposed on one surface of said multilayer wiring structural body, and an electronic component disposed on another surface of said multilayer wiring structural body opposite to the one surface of the multilayer wiring structural body, the electronic component being electrically connected to the multilayer wiring structural body, the manufacturing method comprising:

providing a metal plate;

forming the multilayer wiring structural body on the metal plate such that the metal plate supports the multilayer wiring structural body while forming the multilayer wiring structural body, wherein the multilayer wiring structural body is formed in a series of steps with a first layer being formed on the metal plate and a plurality of successive layers being formed on top of the first layer;

patterning the metal plate to form the antenna in the metal plate;

forming a connection part for the electronic component on the another surface of said multilayer wiring structural body; and mounting the electronic component on the connection part.

7. The method of manufacturing a semiconductor device as claimed in claim 6, wherein forming the antenna is performed before forming the multilayer wiring structural body.

8. A method of manufacturing a semiconductor device, the semiconductor device including a multilayer wiring structural body having a laminated wiring pattern and an insulating layer, an antenna disposed on one surface of said multilayer wiring structural body, and an electronic component disposed on another surface of said multilayer wiring structural body opposite to the one surface of the multilayer wiring structural body, the electronic component being electrically connected to the multilayer structural body, the manufacturing method comprising:

providing a metal plate;

forming the multilayer wiring structural body on the metal plate such that the metal plate supports the multilayer wiring structural body while forming the multilayer wiring structural body, wherein forming the multiplayer wiring structural body further comprises:

forming a first insulating layer on the metal plate;

forming first openings in the insulating layer to the metal plate; and forming first wirings with conductive metal by electrolytic plating at least in the first openings;

patterning the metal plate to form the antenna in the metal plate;

forming a connection part for the electronic component on the another surface of said multilayer wiring structural body; and mounting the electronic component on the connection part.

9. The method of manufacturing a semiconductor device of claim 8, further comprising:

forming a second insulating layer at least on the first wirings;

forming second opening in the second insulating layer to the first wirings; and forming second wirings with conductive metal by electrolytic plating at least in the second openings.

10. The method of manufacturing a semiconductor device as claimed in claim 8, wherein forming the antenna is performed before forming the multilayer wiring structural body.

* * * * *